(12) United States Patent
Yamazaki

(10) Patent No.: US 7,411,211 B1
(45) Date of Patent: Aug. 12, 2008

(54) CONTACT STRUCTURE AND SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/619,477

(22) Filed: Jul. 19, 2000

(30) Foreign Application Priority Data

Jul. 22, 1999 (JP) ................... 11-207041

(51) Int. Cl.
*H01L 29/04* (2006.01)
*H01L 29/15* (2006.01)

(52) U.S. Cl. .......................... 257/59; 257/72
(58) Field of Classification Search ............ 345/92; 349/149, 151, 152, 138; 438/640, 608, 609, 438/149, 158; 257/347
See application file for complete search history.

(56) References Cited

U.S. PATENT DOCUMENTS

| | | | | |
|---|---|---|---|---|
| 4,352,724 A | * | 10/1982 | Sugishima et al. | 204/192.37 |
| 4,780,794 A | | 10/1988 | Mase et al. | |
| 4,820,612 A | | 4/1989 | Mase et al. | |
| 4,828,967 A | | 5/1989 | Mase et al. | |
| 5,208,690 A | * | 5/1993 | Hayashi et al. | 349/143 |
| 5,608,559 A | * | 3/1997 | Inada et al. | 349/149 |
| 5,636,329 A | * | 6/1997 | Sukegawa et al. | 349/149 |
| 5,648,674 A | * | 7/1997 | Weisfield et al. | 257/428 |
| 5,668,379 A | * | 9/1997 | Ono et al. | 257/59 |
| 5,734,458 A | * | 3/1998 | Ikubo et al. | 349/149 |
| 5,821,159 A | * | 10/1998 | Ukita | 438/592 |
| 5,835,177 A | * | 11/1998 | Dohjo et al. | 349/147 |

(Continued)

FOREIGN PATENT DOCUMENTS

CN            85109696            7/1986

(Continued)

OTHER PUBLICATIONS

Specification, Claims, Abstract, Drawings of U.S. Appl. No. 09/615,449 to Suzawa et al.

(Continued)

*Primary Examiner*—Kiesha Rose
(74) *Attorney, Agent, or Firm*—Eric J. Robinson; Robinson Intellectual Property Law Office, P.C.

(57) ABSTRACT

To improve the reliability of contact with an anisotropic conductive film in a semiconductor device such as a liquid crystal display panel, a terminal portion (182) of a connecting wiring (183) on an active matrix substrate is electrically connected to an FPC (191) by an anisotropic conductive film (195). The connecting wiring (183) is manufactured in the same process with a source/drain wiring of a TFT on the active matrix substrate, and is made of a lamination film of a metallic film and a transparent conductive film. In the connecting portion with the anisotropic conductive film (195), a side surface of the connecting wiring (183) is covered with a protecting film (173) made of an insulating material. Accordingly, the portion in which the metallic film is surrounded by the transparent conductive film, the insulating base film, and the protecting film (173) to which it is in contact with, can be avoided from exposure to air because the side surface of the metallic film of the connecting wiring is covered with the protecting film (173).

31 Claims, 30 Drawing Sheets

U.S. PATENT DOCUMENTS

| | | | | |
|---|---|---|---|---|
| 5,849,611 | A | * | 12/1998 | Yamazaki et al. ............ 438/151 |
| 5,897,377 | A | * | 4/1999 | Suzuki ....................... 438/706 |
| 5,913,100 | A | * | 6/1999 | Kohsaka et al. ............. 428/546 |
| 6,043,859 | A | * | 3/2000 | Maeda ....................... 349/143 |
| 6,072,556 | A | | 6/2000 | Hirakata et al. |
| 6,093,457 | A | | 7/2000 | Okumura et al. |
| 6,169,593 | B1 | * | 1/2001 | Kanaya et al. ............... 349/187 |
| 6,215,077 | B1 | * | 4/2001 | Utsumi et al. ............... 174/268 |
| 6,226,060 | B1 | * | 5/2001 | Onisawa et al. ............... 349/43 |
| 6,239,854 | B1 | | 5/2001 | Hirakata et al. |
| 6,383,327 | B1 | | 5/2002 | Mase |
| 6,567,146 | B2 | | 5/2003 | Hirakata et al. |

FOREIGN PATENT DOCUMENTS

| | | | |
|---|---|---|---|
| CN | 1222684 | | 7/1999 |
| EP | 0 187 535 | | 7/1986 |
| JP | 55098832 A | * | 7/1980 |
| JP | 57147253 A | * | 9/1982 |
| JP | 59028344 A | * | 2/1984 |
| JP | 59214228 A | * | 12/1984 |
| JP | 63161645 A | * | 7/1988 |
| JP | 02244631 A | * | 9/1990 |
| JP | 04133027 A | * | 5/1992 |
| JP | 04333224 A | * | 11/1992 |
| JP | 08-227079 | | 9/1996 |
| JP | 8-234212 A | * | 9/1996 |
| JP | 09-189737 | | 7/1997 |
| JP | 09213968 A | * | 8/1997 |
| JP | 09251996 A | * | 9/1997 |
| JP | 09-279367 | | 10/1997 |
| KR | 0169443 | | 3/1999 |

OTHER PUBLICATIONS

Official Filing Receipt, Specification, Abstract, Drawings of U.S. Appl. No. 09/433,705 to Yamazaki, filed Nov. 4, 1999, including Pending Claims and Official Filing Receipt.

Office Action, Chinese Patent Office, dated Jan. 28, 2005 for Application No. 00121737.2.

* cited by examiner

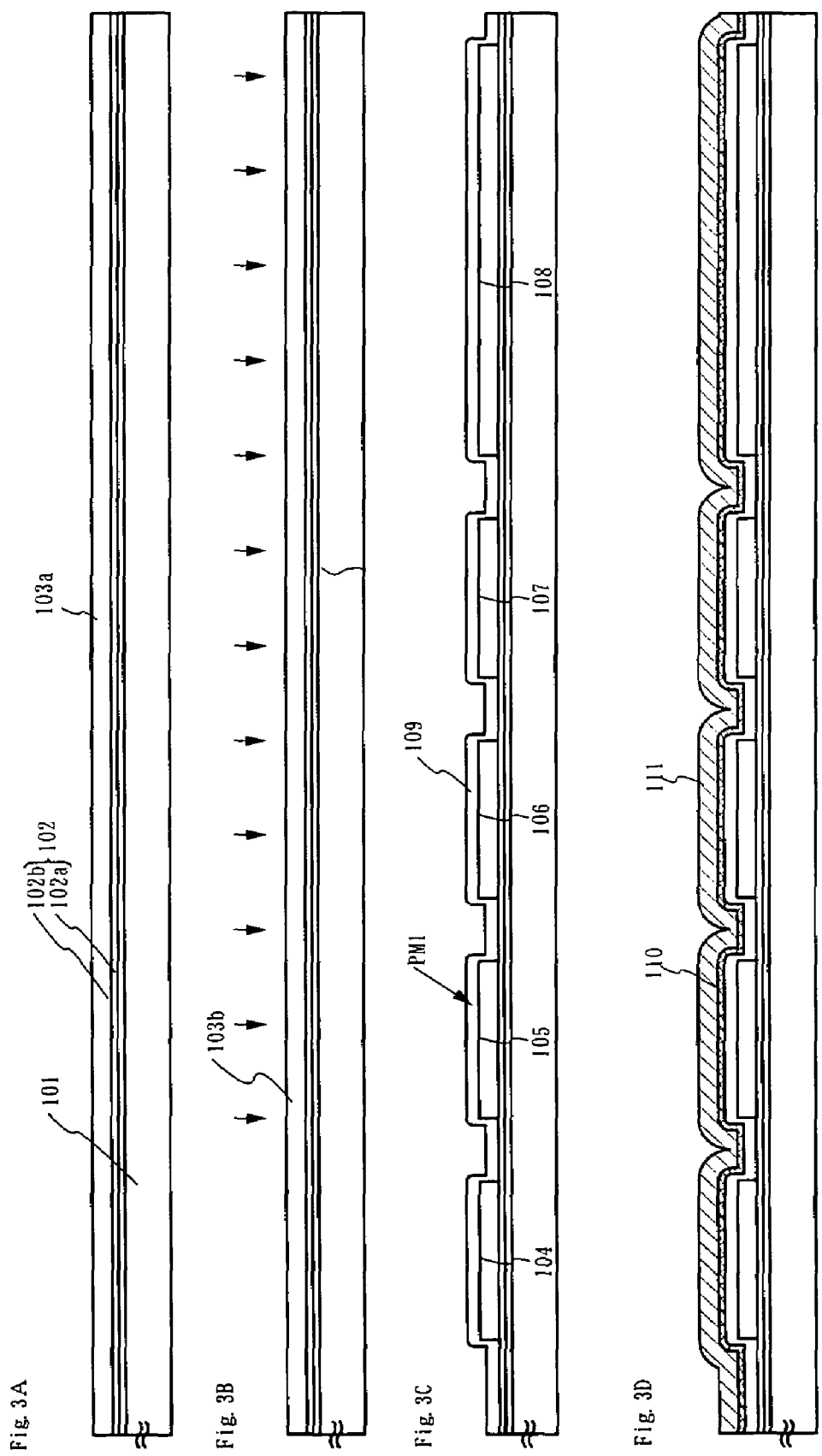

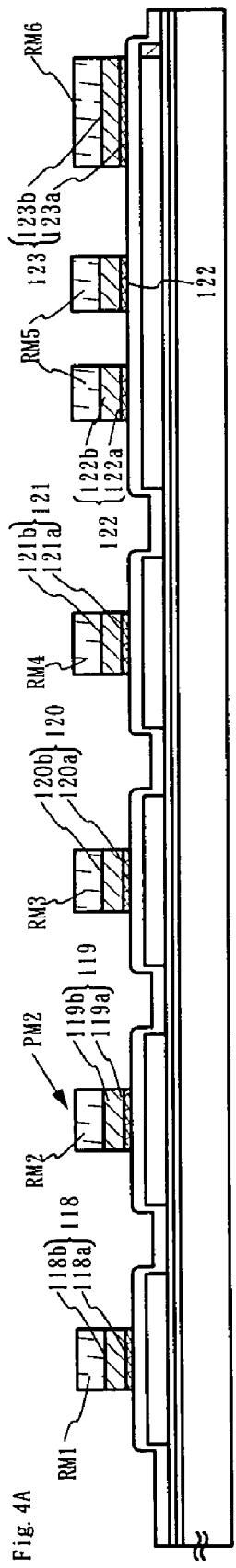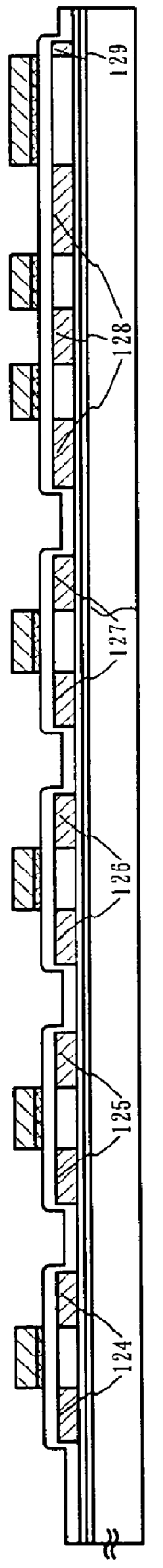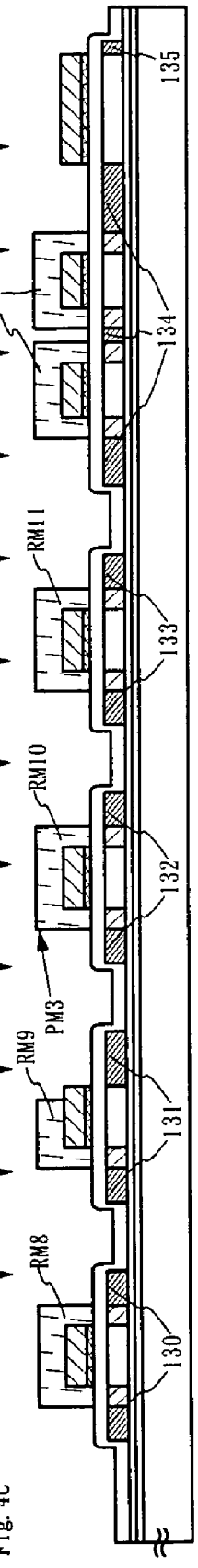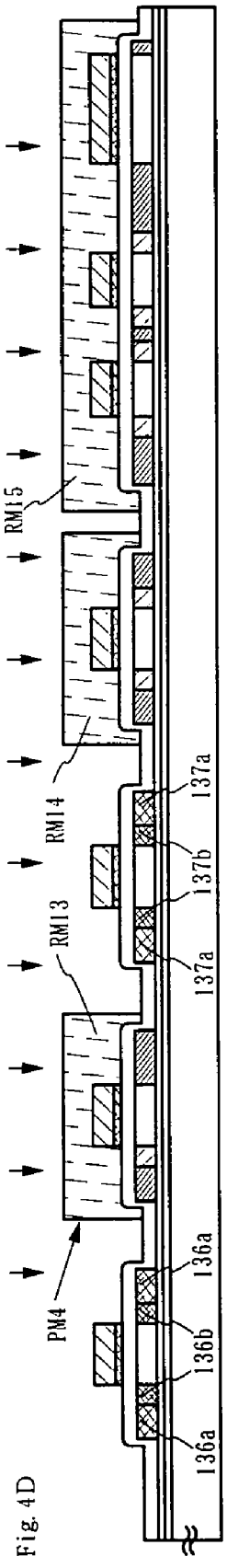

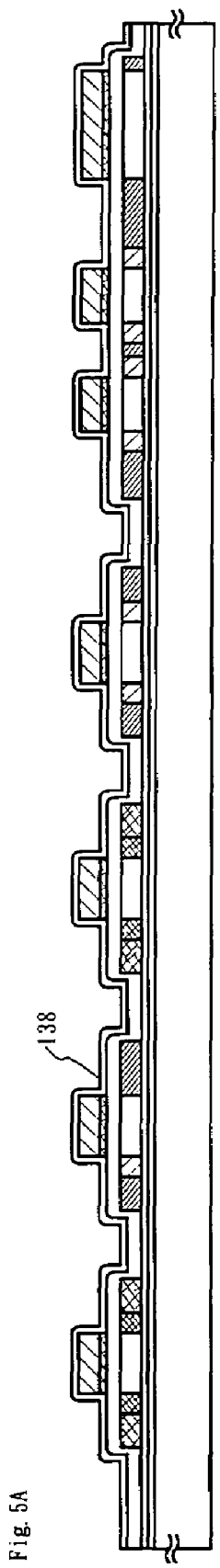
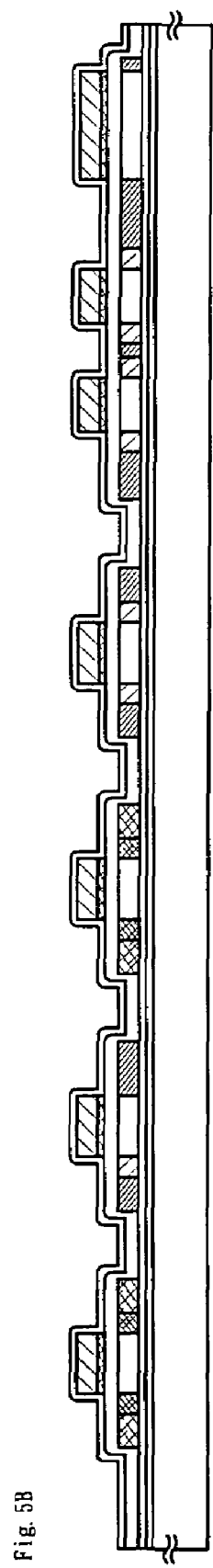
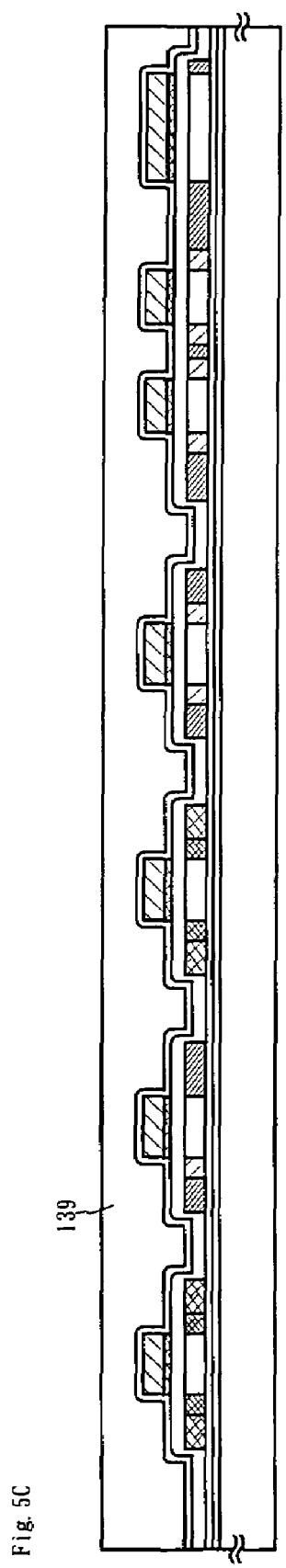
Fig. 5A
Fig. 5B
Fig. 5C

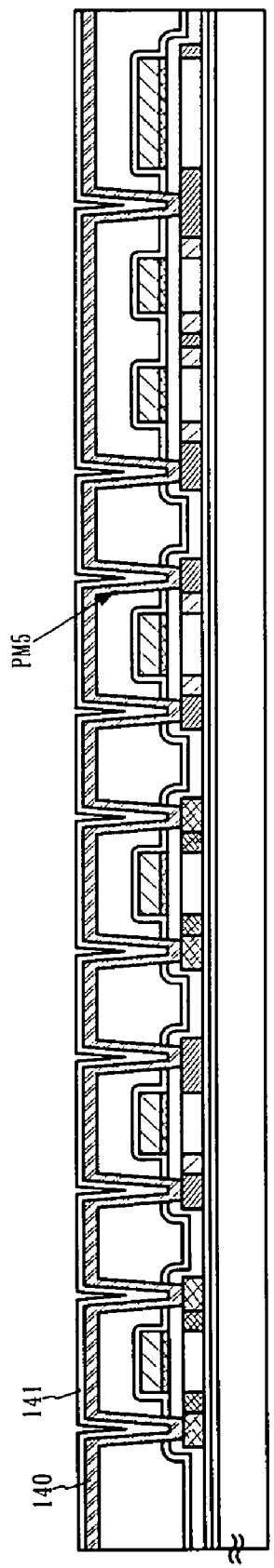
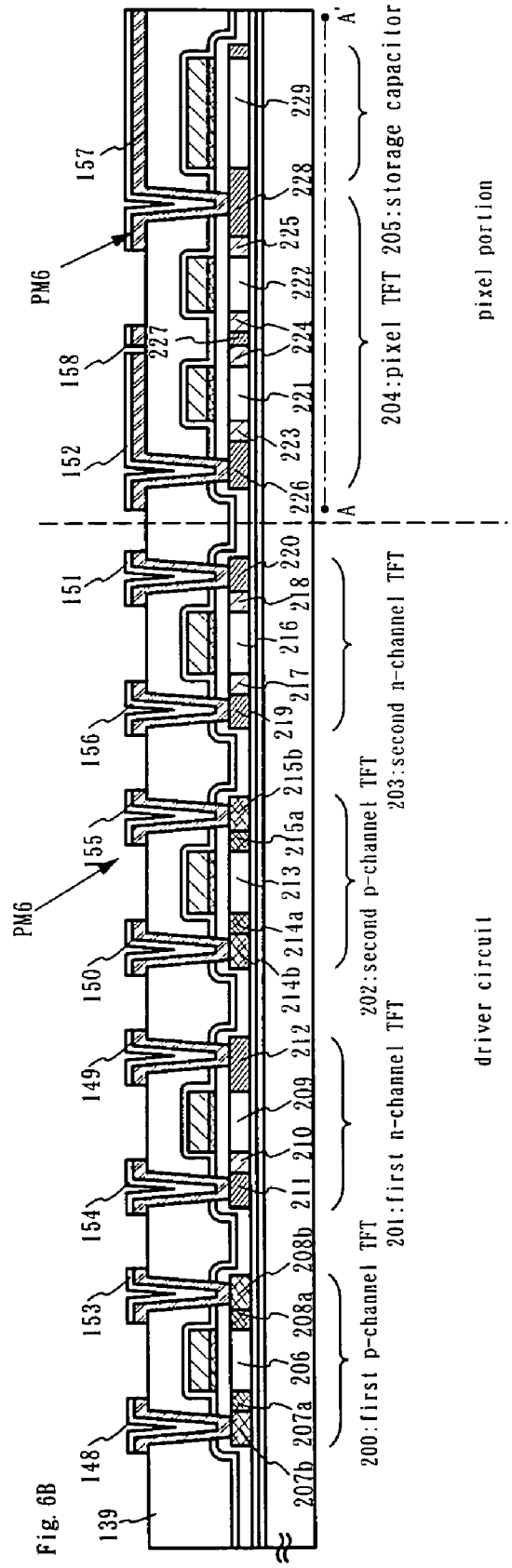
Fig. 6A
Fig. 6B

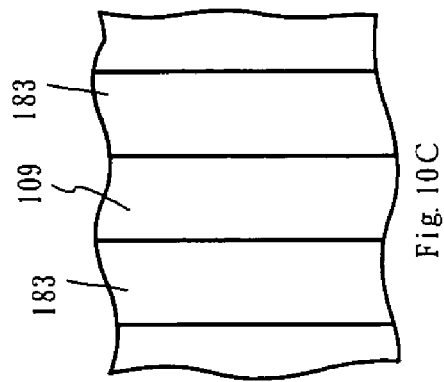
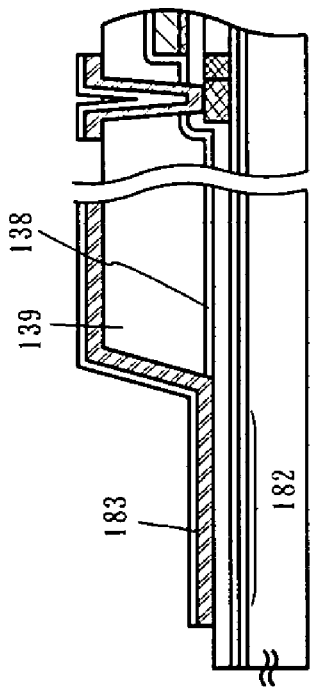
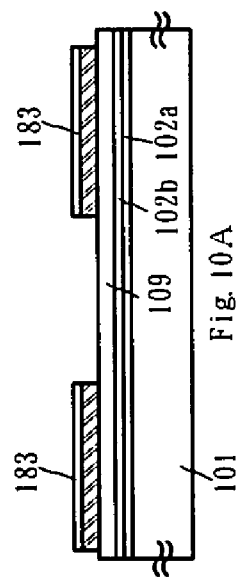

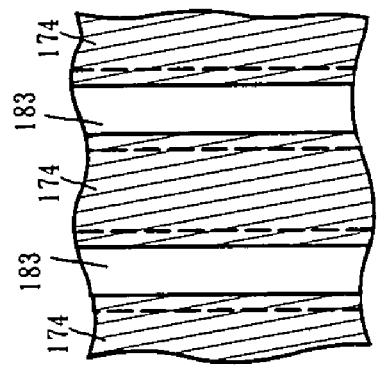
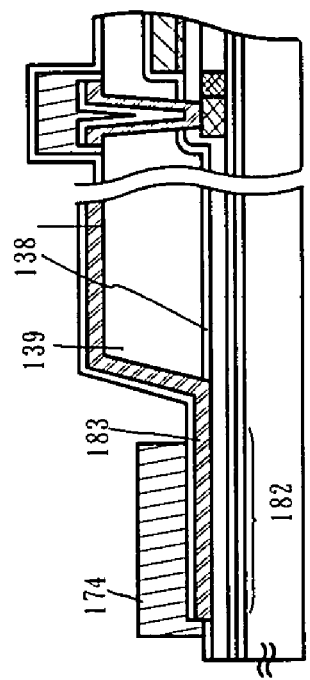
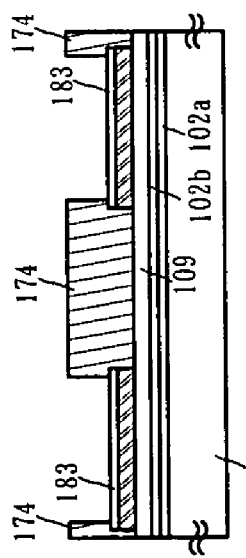

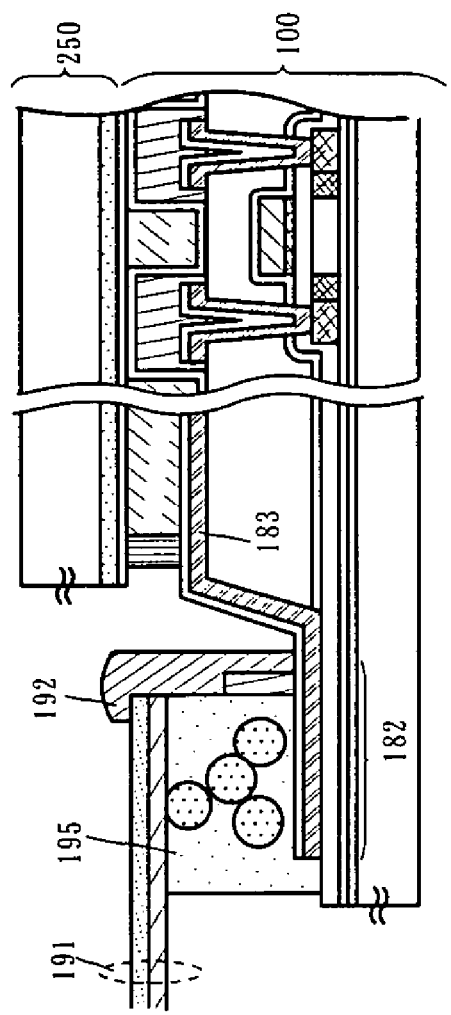
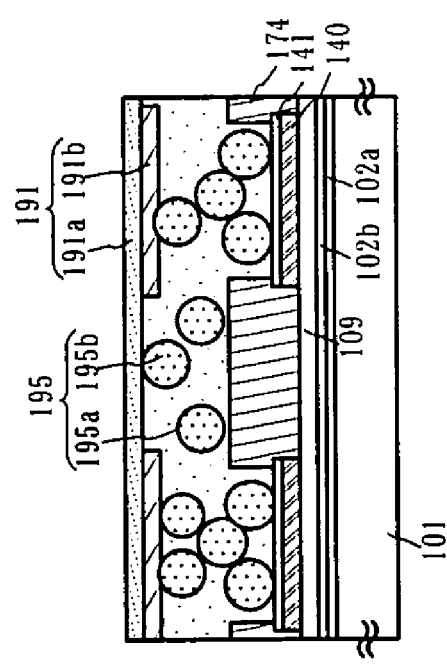
Fig. 12B
Fig. 12A

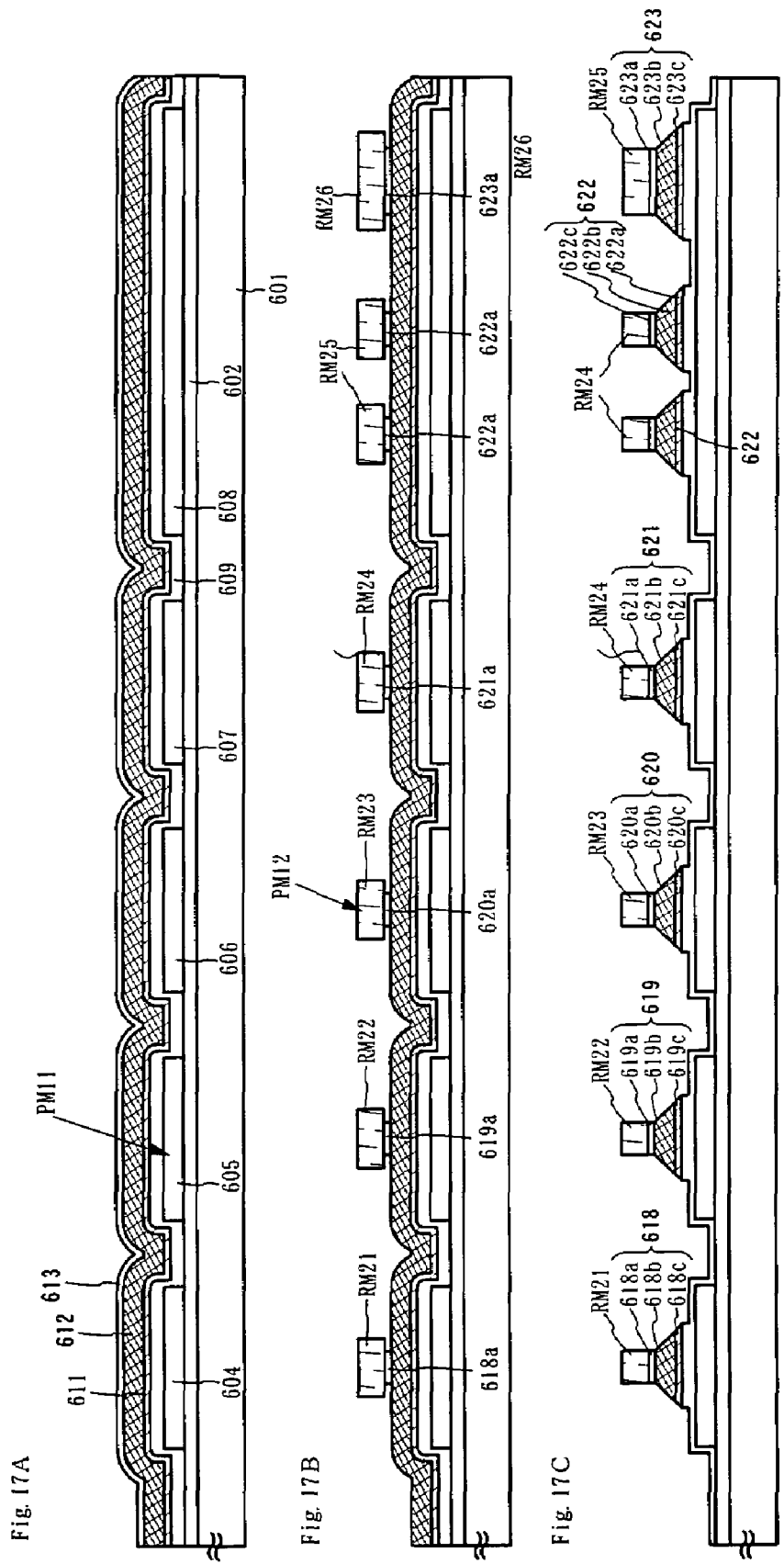

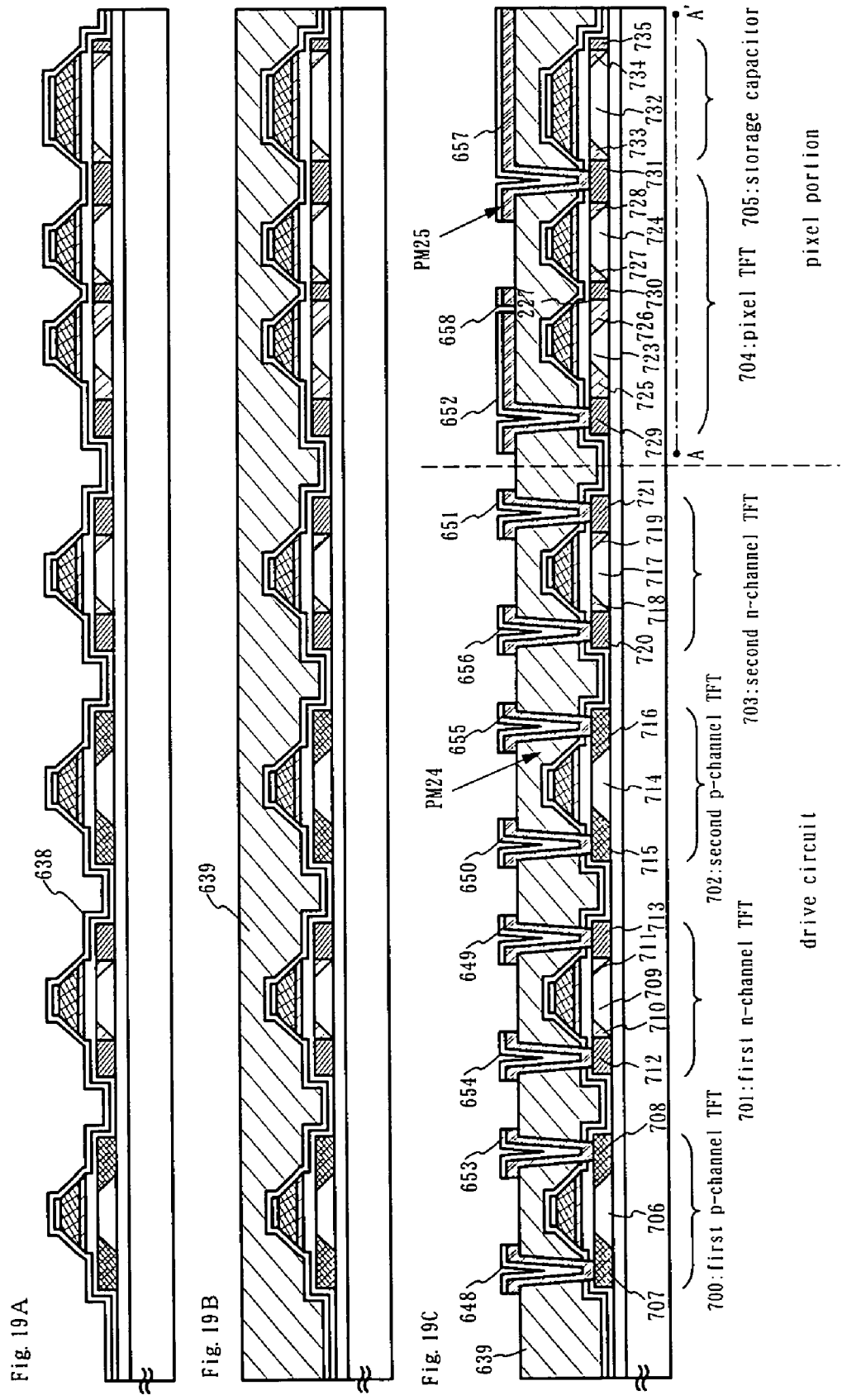

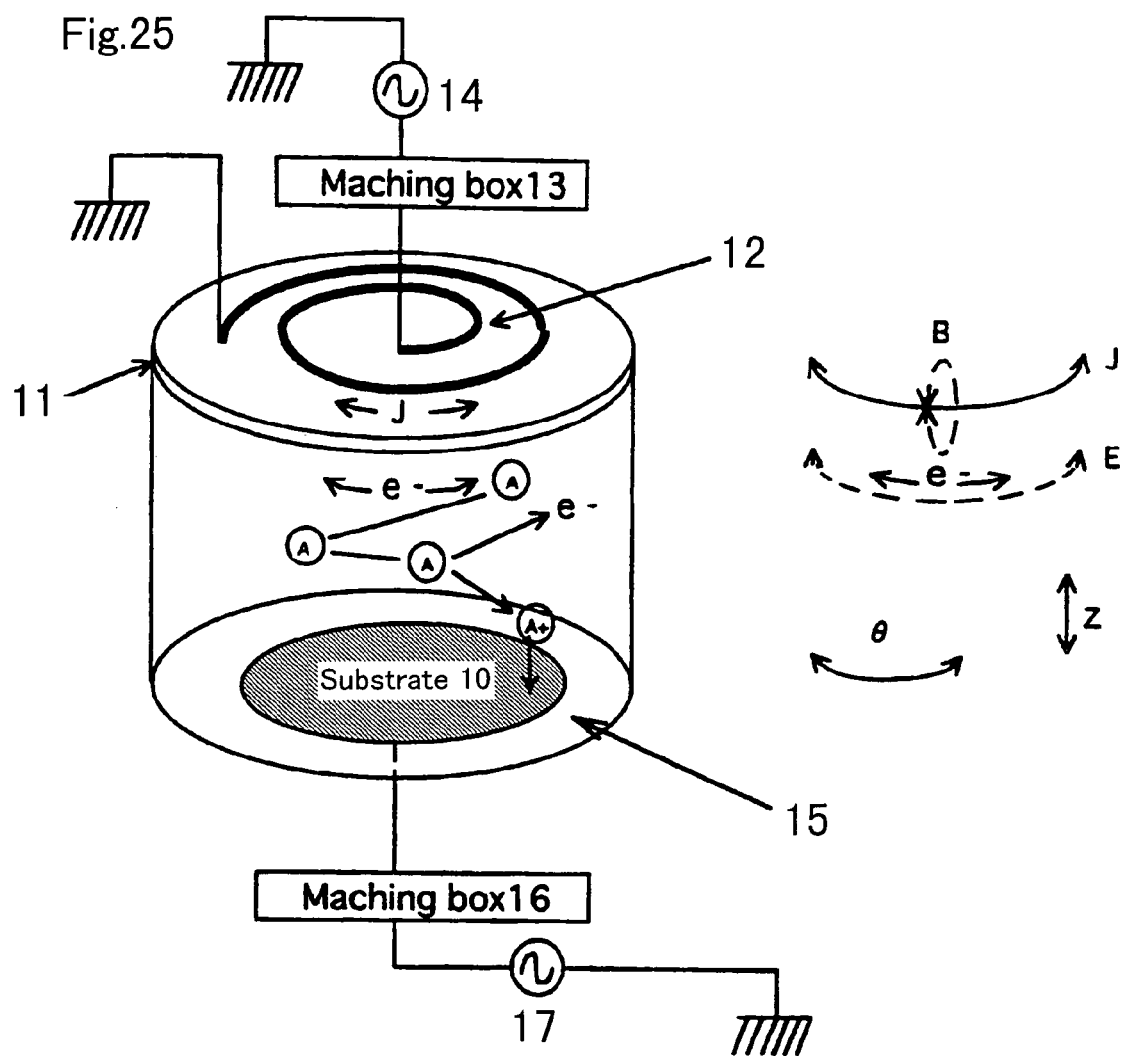

CONTACT STRUCTURE AND SEMICONDUCTOR DEVICE

BACKGROUND OF THE INVENTION

1. Field of the Invention

The present invention relates to a semiconductor device comprising a circuit structured with a thin film transistor (hereinafter referred to as TFT) formed on a substrate having an insulating surface, and also relates to a structure of a terminal for connecting the circuit structured with the TFT to a circuit on another substrate. More particularly, the present invention provides a technique suitable for use in a liquid crystal display device having a pixel portion and a driver circuit provided in the periphery of the pixel portion on the same substrate, an electro-luminescence display device, and electronic equipment mounted with an electro-optical device incorporating the above display devices. Note that in the present specification, the semiconductor device indicates general devices that may function by use of semiconductor characteristics, and that not only the above liquid crystal display device, but also the above electronic equipment incorporating the display device are categorized as the semiconductor device.

2. Description of the Related Art

In the electro-optical device, typically an active matrix type liquid crystal display device, a technique in which a TFT is utilized for the purpose of structuring a switching element and an active circuit has been developed. A TFT is formed with a semiconductor film as an active layer formed on a substrate such as a glass substrate by vapor phase growth. A material such as silicon or silicon germanium having silicon as its principal constituent is suitably utilized for the semiconductor film. In addition, an amorphous silicon film or a crystalline silicon film typically such as a polycrystalline silicon film can be obtained depending on the manufacturing method of the silicon semiconductor film.

The TFT using the amorphous silicon film as the active layer essentially cannot attain an electric field effect mobility of several $cm^2/Vsec$ or more because of electronic properties caused by the amorphous structure, or the like. Accordingly, despite being able to utilize the TFT as the switching element (pixel TFT) for driving the liquid crystals provided in each pixel in the pixel portion, it is impossible to form the TFT up to a point as a driver circuit for performing image display. In order to provide a driver circuit for performing image display, a technique in which a driver IC is mounted by the TAB (Tape Automated Bonding) method or the COG (Chip On Glass) method has been employed.

On the other hand, with the TFT using the crystalline silicon film as the active layer, it is possible to attain a high electric field effect mobility to form various functional circuits on the same glass substrate. Besides the pixel TFT, in the driver circuit, circuits basically formed of a CMOS circuit consisting of an n-channel TFT and a p-channel TFT, such as a shift resistor circuit, a level shifter circuit, a buffer circuit, and a sampling circuit, can be manufactured on the same substrate. An active matrix substrate having the pixel and the driver circuit for driving the pixel formed on the same substrate is utilized in the active matrix type liquid crystal display device for the purpose of reducing cost and improving quality.

In the active matrix substrate such as the above, in order to supply electric power and an input signal to the driver circuit, a connecting wiring connected to the driver circuit is formed on the active matrix substrate. A structure mounted with the connecting wiring and an FPC (Flexible Print Circuit) is being adopted. An anisotropic conductive film is used for the connection of the connecting wiring and the FPC on the substrate. FIG. 30 shows a sectional structure of the connecting wiring connected to the FPC by means of the anisotropic conductive film.

As shown in FIG. 30, in the active matrix substrate, a connecting wiring 3 is formed on an insulating film 2 that is on the surface of a glass substrate 1. The FPC 4 includes a substrate made of a flexible material such as polyimide, and a plurality of wiring 6 made of copper etc. are formed thereon. In an anisotropic conductive film 7, conductive spacers 8 are dispersed into an adhesive 9 (resin) that cures from heat or light. The connecting wiring 3 is electrically connected to a wiring 6 on the FPC 4 by a conductive spacer 8.

The connecting wiring 3 is a two multi-layer structure consisting of a metallic film 3a such as aluminum and titanium and a transparent conductive film 3b such as an ITO film. Since the transparent conductive film 3b utilizes a metallic film such as aluminum, its wiring resistance can be lowered. Hence, there is fear that the metallic film 3a may be deformed due to being pressed by a conductive spacer 8. The transparent conductive film 3b is made of metal oxide such as indium and tin, thus its degree of hardness is higher than the metallic film 3a. Accordingly, the transparent conductive film 3b is formed on the surface of the metallic film, preventing the metallic film 3a from being damaged or deformed.

Nonetheless, a side surface of the metallic film 3a is in an uncovered state, and exposed to air until an anisotropic conductive film 7 is formed. The metallic film 3a is under a state easily exposed to corrosion and oxidation, the cause of lowering the connection reliability of the connecting wiring 3 and the FPC 4. Furthermore, the side surface of the metallic film 3a is touching the resin in a state where the FPC 4 is mounted, causing a problem in protecting against moisture.

SUMMARY OF THE INVENTION

The present invention has been made to solve the above-mentioned problems, and therefore has an object thereof to realize a high reliability connection between an FPC and the connecting wiring, and to provide a connecting wiring suitable for mass production.

In order to solve the above problems, according to one aspect of the present invention, there is provided a contact structure for electrically connecting a connecting wiring on a substrate to a wiring on another substrate by means of an anisotropic conductive film, characterized in that the lead wiring is a lamination film formed of a metallic film and a transparent conductive film, and in a connecting portion with the anisotropic conductive film, a side surface of the metallic film is covered with a protecting film.

Further, according to another aspect of the present invention, there is provided a semiconductor device having, on a substrate, a circuit structured with a thin film transistor, and a connecting wiring for connecting the circuit structured with the thin film transistor to another circuit, characterized in that the connecting wiring is a lamination film of a metallic film and a transparent conductive film, and in a connecting portion with the other circuit, a side surface of the metallic film is covered with a protecting film.

Further, according to another aspect of the present invention, there is provided a semiconductor device comprising a first substrate having a circuit structured with a thin film transistor and a second substrate opposing the first substrate, characterized in that a connecting wiring, formed of a metallic film and a transparent conductive film in contact with the metallic film surface for connecting the circuit structured with a thin film transistor to another circuit, and a protecting film in contact with a side surface of the metallic film, are formed on the first substrate.

Still further, according to another aspect of the present invention, there is provided a semiconductor device comprising a first substrate having a circuit structured with a thin film transistor and a second substrate opposing the first substrate, characterized in that a connecting wiring formed of a metallic film and a transparent conductive film in contact with the metallic film surface, for connecting the circuit structured with a thin film transistor to another circuit a column-shape spacer for maintaining a space between the first substrate and the second substrate, formed on the thin film transistor, and a protecting film in contact with a side surface of the metallic film formed of a same material as that of the column-shape spacer, are formed on the first substrate.

BRIEF DESCRIPTION OF THE DRAWINGS

In the accompanying drawings:

FIGS. 3A to 3D are sectional views showing a manufacturing process of an active matrix substrate;

FIGS. 4A to 4D are sectional views showing a manufacturing process of an active matrix substrate;

FIGS. 5A to 5C are sectional views showing a manufacturing process of an active matrix substrate;

FIGS. 6A and 6B are sectional views showing a manufacturing process of an active matrix substrate;

FIGS. 10A to 10C are sectional views showing a manufacturing process of a terminal portion of a connecting wiring;

FIGS. 11A to 11C are sectional views showing a manufacturing process of a terminal portion of a connecting wiring;

FIGS. 12A and 12B are sectional views showing a contact structure of a terminal portion of the connecting wiring and an anisotropic conductive film;

FIGS. 17A to 17C are sectional views showing a manufacturing process of an active matrix substrate;

FIGS. 19A to 19C are sectional views showing a manufacturing process of an active matrix substrate;

FIG. 25 is a diagram showing a plasma producing mechanism of an ICP etching device;

DETAILED DESCRIPTION OF THE PREFERRED EMBODIMENTS

Embodiment Mode 1

Figure 1A:
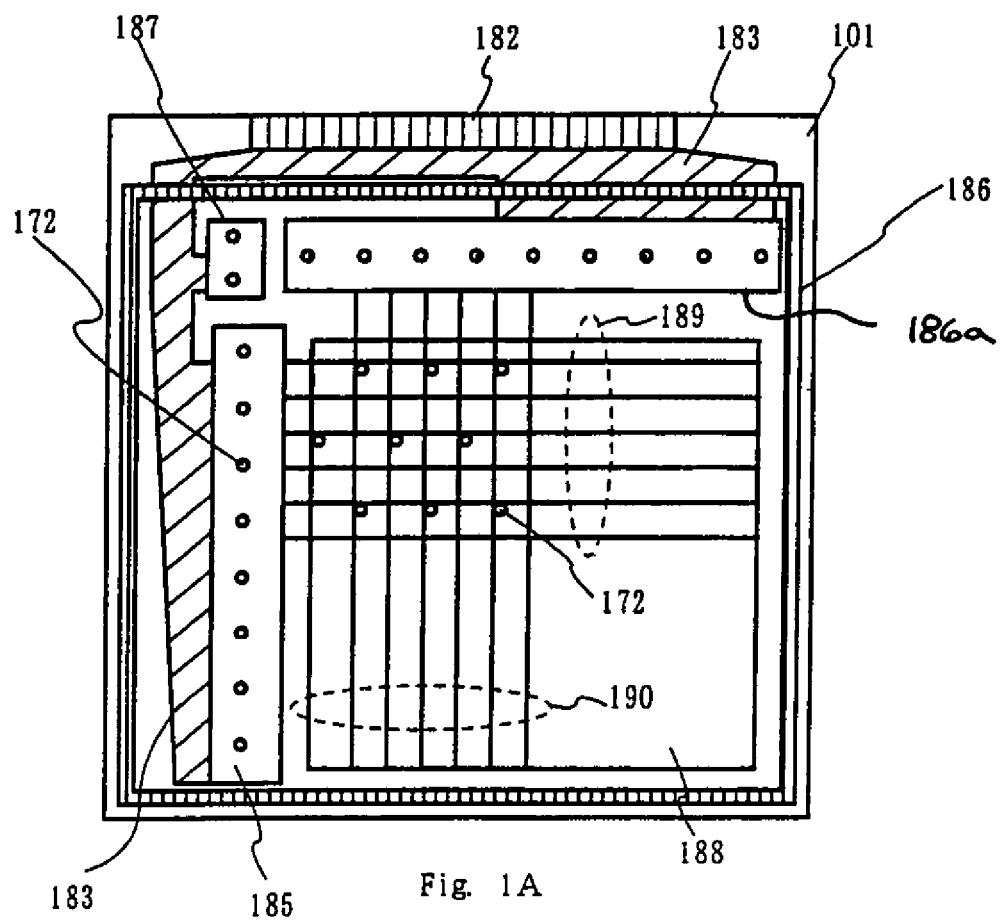
FIGS. 1A and 1B are diagrams showing top views for explaining a structure of an active matrix substrate.

A contact structure according to the present invention is suitable for a semiconductor device that uses a mounting method in which circuits are connected by means of an anisotropic conductive film, such as an active matrix type liquid crystal display device or an EL display device. Referring to FIGS. 12A and 12B, the contact structure of the present invention when applied to the active matrix type liquid crystal display device is described in Embodiment Mode 1.

A connecting wiring 183 on an active matrix substrate is electrically connected to an FPC 191 by an anisotropic conductive film 195 in a terminal portion 182. The connecting wiring 183 is formed in the same process in which a source/drain wiring of a TFT on the active matrix substrate is formed. In other words, the connecting wiring 183 is formed from the same material and in the same layer as that of the source/drain wiring. The connecting wiring 183 is a lamination film of a metallic film 140 and a transparent conductive film 141. In a connecting portion with the anisotropic conductive film 195, a side surface of the connecting wiring 183 is covered with a protecting film 174.

A side surface of the metallic film 140 is covered with the protecting film 174 in this structure. Accordingly, in the connecting portion, the metallic film 140 is surrounded by and contacts with the transparent conductive film 141, an insulating film 109, and the protecting film 174, with no chance of being exposed to air. Consequently, corrosion of the metallic film 140 can be prevented.

The protecting film 174 can be formed by using the insulating film formed on the upper layer of the source/drain wiring. In Embodiment Mode 1, the protecting film 174 is formed in the same process with a column-shape spacer 172 that is formed for the purpose of maintaining a space between the active matrix substrate and an opposing substrate.

Figure 16:
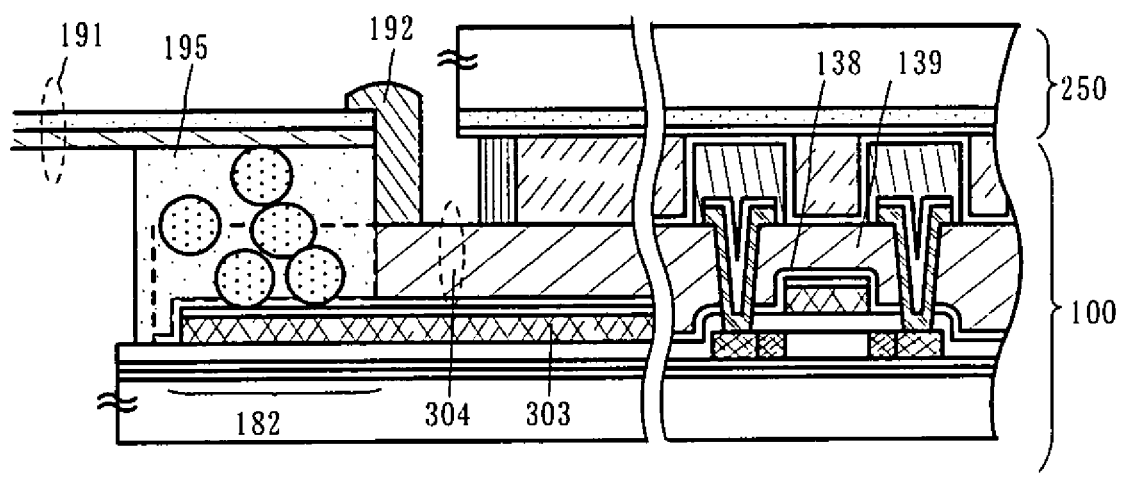
FIG. 16 is a sectional view showing a contact structure of a terminal portion of the connecting wiring and an anisotropic conductive film.

Furthermore, a connecting wiring 303 can be formed in the same process with a gate wiring of the TFT as shown in FIG. 16. In this case, the connecting wiring 303 is formed from the same material and in the same layer as the gate wiring. Also in this case, a protecting film 304 is formed from insulating films 138 and 139 formed between the gate wiring and the source/drain wiring.

According to the present invention, the connecting wiring is formed of a lamination film in which a transparent conductive film is formed covering the surface of the metallic film. The metallic film is not limited to a single layer film. The thickness of the metallic film is between 100 nm and 1 μm. The metallic film may be a metallic layer having an element selected from the group consisting of aluminum (Al), tantalum (Ta), titanium (Ti), molybdenum (Mo), and tungsten (W) as its principal constituent, or at least containing an alloy layer which contains a metallic element. The following may be given as the alloy: Mo—W alloy, Mo—Ta alloy, or nitrated compounds with the listed elements above such as tantalum nitride (TaN), tungsten nitride (WN), titanium nitride (TiN), and molybdenum nitride (MoN). In addition, a silicide layer such as tungsten silicide, titanium silicide, and molybdenum silicide may be included in the metallic film.

The thickness of the transparent conductive film is between 50 nm and 5 mm. Materials such as indium oxide ($In_2O_3$), or an indium oxide/tin oxide alloy ($In_2O_3$—$SnO_2$:ITO) formed by utilizing the sputtering method and the vacuum evaporation method may be used as materials for the transparent conductive film. The etching treatment of this type of material is performed with hydrochloric acid solutions. However, particularly the etching of ITO readily generates residues. Therefore, an indium oxide/zinc oxide alloy ($In_2O_3$—ZnO) may be used in order to be suitable for the etching process. The indium oxide/zinc oxide alloy has excellent flat and smooth surface properties, and contrary to ITO, also has excellent thermal stability. Accordingly, at an edge surface of a drain wiring 169 where it comes in contact with Al, corrosion reaction with Al can be prevented. Similarly, zinc oxide (ZnO) is also a suitable material. In order to further improve the transmissivity of visible light and conductivity, zinc oxide doped with gallium (ZnO:G), etc. may be used.

Embodiment Mode 2

Further, for the case of forming the connecting wiring in the same process with the gate wiring, the shape of the sectional surfaces of the gate wiring and the connecting wiring can be taper shapes. By forming the gating wiring into a taper shape, film thickness is reduced from the center towards the side surface. Because of this variation in film thickness, as shown in an embodiment which will be explained later, changing an impurity concentration to be doped into the semiconductor film can be made by utilizing the variation in film thickness in a process of doping for the semiconductor film with the gate wiring as a mask.

Dry etching utilizing high-density plasma is applied in order to form a taper shaped gate wiring. As a means of achieving high-density plasma, an etching device that utilizes a microwave or an ICP (Inductively Coupled Plasma) is suitable. Particularly, the ICP etching device can easily control plasma as well as deal with the operation of processing for a large area surface substrate.

As a means for performing plasma treatment with high precision, a plasma treatment device utilizing the ICP employs a method of forming plasma by applying high frequency electric power to a multi-spiral coil formed from 4 whirlpool shaped coil parts connected in series via an impedance matching apparatus. The length of each whirlpool shaped coil parts is set to be ¼ times longer than the wavelength of the high frequency. In addition, the plasma treatment device structured such that a different high frequency electric power is also applied to a base electrode for holding the object to be treated to thereby add a bias voltage. The plasma treatment method utilizing an ICP and plasma treatment device are disclosed in Japanese Patent Application Laid-open No. Hei 9-293600.

FIG. 25 schematically shows the structure of the plasma treatment device utilizing such type of ICP (for example, an etching device). On a quartz substrate 11 of a chamber's top portion, an antenna coil 12 is arranged, and connected to an RF electric power source 14 via a matching-box 13. Furthermore, a substrate 10 to be plasma treated is disposed on a base electrode 15 which is provided facing the antenna coil. The base electrode 15 is also connected to an RF electric power source 17 via a matching-box 16. When an RF electric current flow is applied to the antenna coil 12 above substrate, an RF electric current J flows in an α direction in the antenna coil 12 to thereby generate a magnetic field B in a Z direction in accordance with a formula 1.

$\mu_0 J = \text{rot} B$ ($\mu_0$ is permeability)  (Formula 1)

Then, complying with the law of electromagnetic induction of Faraday, an induction electric field E occurs in the θ direction.

$-\partial B/\partial t = \text{rot} E$  (Formula 2)

Plasma is produced when an electron is accelerated in the α direction to thereby collide with a gas molecule in the induction electric field E. Since the direction of the induction electric field E is in the α direction, the probability of losing electric charge due to collision of a charged particle against the wall of the etching chamber or the substrate is reduced. Accordingly, high-density plasma can be generated even at a low pressure of about 1 Pa. Also, there is hardly any magnetic field B in the downward flow, resulting in a high-density plasma region that has widened into a sheet shape.

In order to obtain the high-density plasma with the ICP, it is necessary to flow a high frequency electric current J at a low-loss, which flows to the antenna coil 12, and its impedance must be reduced for the large area. Therefore, it is effective to apply a method in which the antenna coil is split.

Regulating the respective RF powers to be applied to the antenna coil 12 (applied with an ICP power) and the lower electrode 15 of the substrate side (applied with bias power) makes it possible to independently control the plasma density and the self-bias voltage. Additionally, an RF power with different frequencies may be applied in response to the film to be etched.

Figure 26:
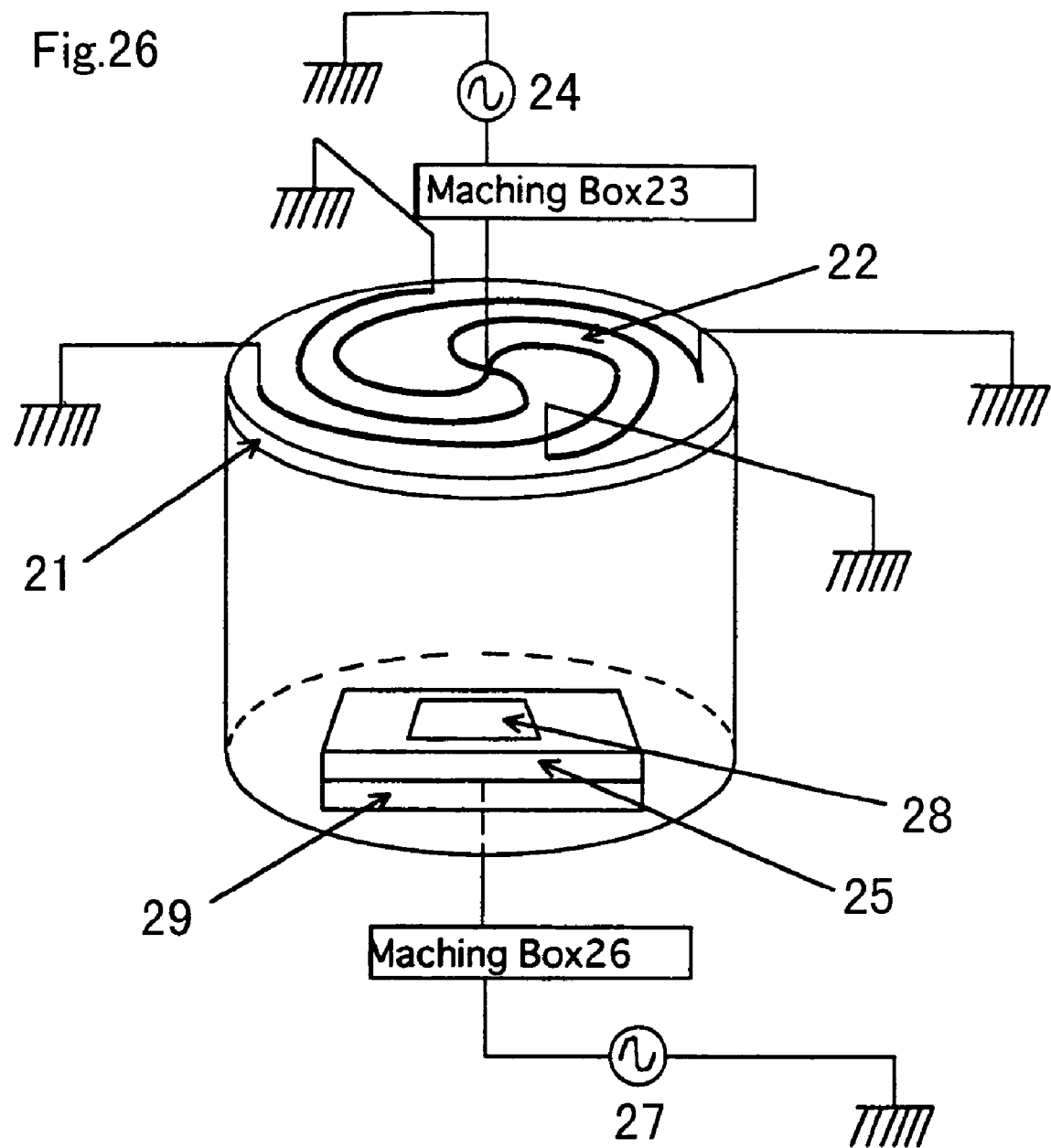
FIG. 26 is a diagram showing an ICP etching device employing a multi-spiral coil method.

To obtain the high-density plasma with the ICP etching device, the RF electric current J that flows to the antenna coil 12 needs to be flowed at a low-loss. The inductance of the antenna coil 12 must be reduced in order to form a large surface area of the substrate. As shown in FIG. 26, an ICP etching device having a multi-spiral coil 22 of a split antenna has been developed to achieve the above stated conditions. In FIG. 26, reference numeral 21 denotes a quartz substrate, reference numerals 23 and 26 denote matching-boxes, and reference numerals 24 and 27 denote RF electric power sources. Further, at the bottom portion of the chamber, a base electrode 25 for holding a substrate 28 is provided via an insulator 29.

If the etching device, which uses the ICP and is applied with the multi-spiral coil, is employed, then the etching of the heat-resistant conductive materials can be performed well and in addition, a wiring with a desirable taper angle θ may be formed.

Figure 27:
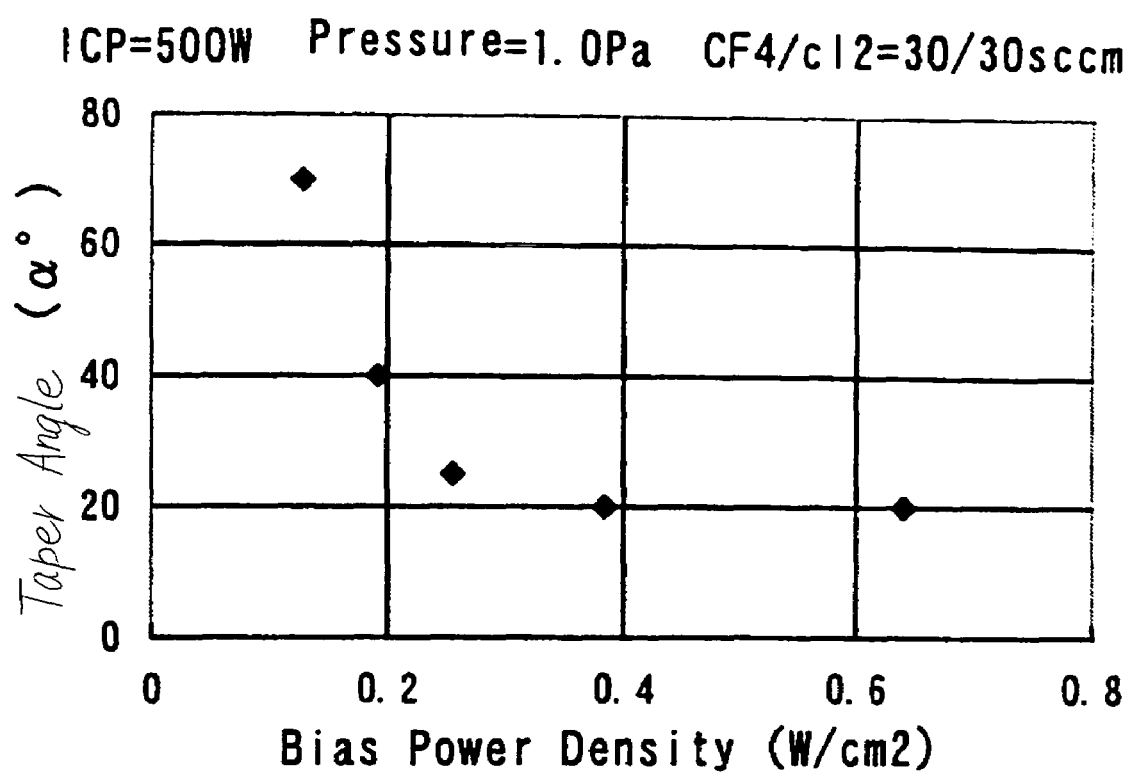
FIG. 27 is a diagram showing a dependency of a taper angle $\theta$ on bias power.
Figure 28:
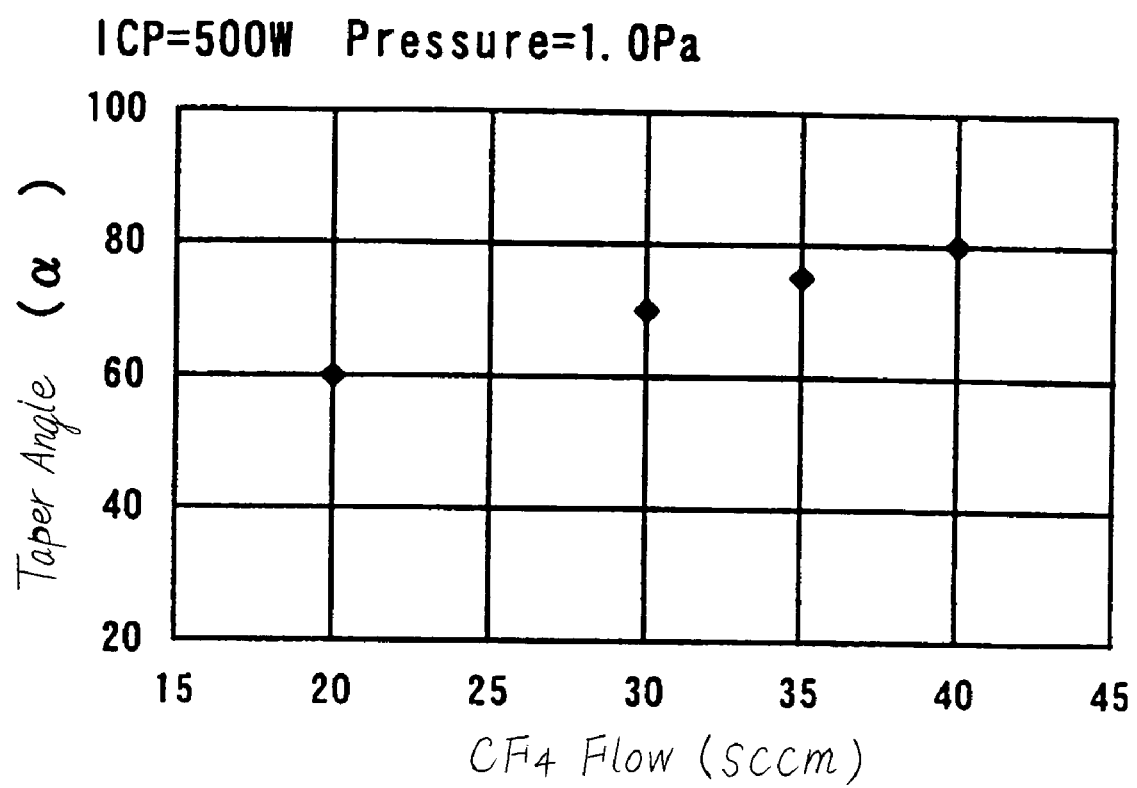
FIG. 28 is a diagram showing a dependency of a taper angle $\theta$ on the ratio of $CF_4$ flow.

A bias power density of the ICP etching device is adjusted to thereby obtain a desired taper angle θ. FIG. 27 is a view showing the bias power dependency of the taper angle θ. As shown in FIG. 27, the taper angle θ can be controlled in response to the bias power density. Shown in FIG. 27 is the result of examining the taper shape (taper angle) of the patterned edge portion of a W film, which has been formed into a fixed pattern on the glass substrate. FIG. 28 shows the bias power (13.56 MHz) dependency of the taper angle and the bias power is applied to the substrate side. As common conditions, the electric discharge power (high frequency power to be applied to the coil, 13.56 MHz) is set to 3.2 W/cm$^2$, the pressure is set to 1.0 Pa, and CF$_4$ and Cl$_2$ are used as the etching gas. The quantity of flow of the etching gas CF$_4$ and Cl$_2$, are both set to 30 SCCM.

As shown in FIG. 27, it has become apparent that when the bias power is in the range of 128 to 384 mW/cm$^2$, the taper angle may be altered between 70° and 20°. Note that the quantity of flow of CF$_4$ and Cl$_2$ are both set to 30 SCCM.

It is also possible to alter the taper angle from 60° to 80° as can be known from the experiment shown in FIG. 28. The experiment conditions of FIG. 28 show the results of examining the dependency of the taper angle on the ratio of the quantity of flow of etching gas. Note that the quantity of flow of CF$_4$ is altered in a range of from 20 to 40 SCCM with the condition that the total quantity of flow of CF$_4$ and Cl$_2$ is set to 60 SCCM. The bias power at this point is set to 128 mW/cm$^2$.

Figure 29:
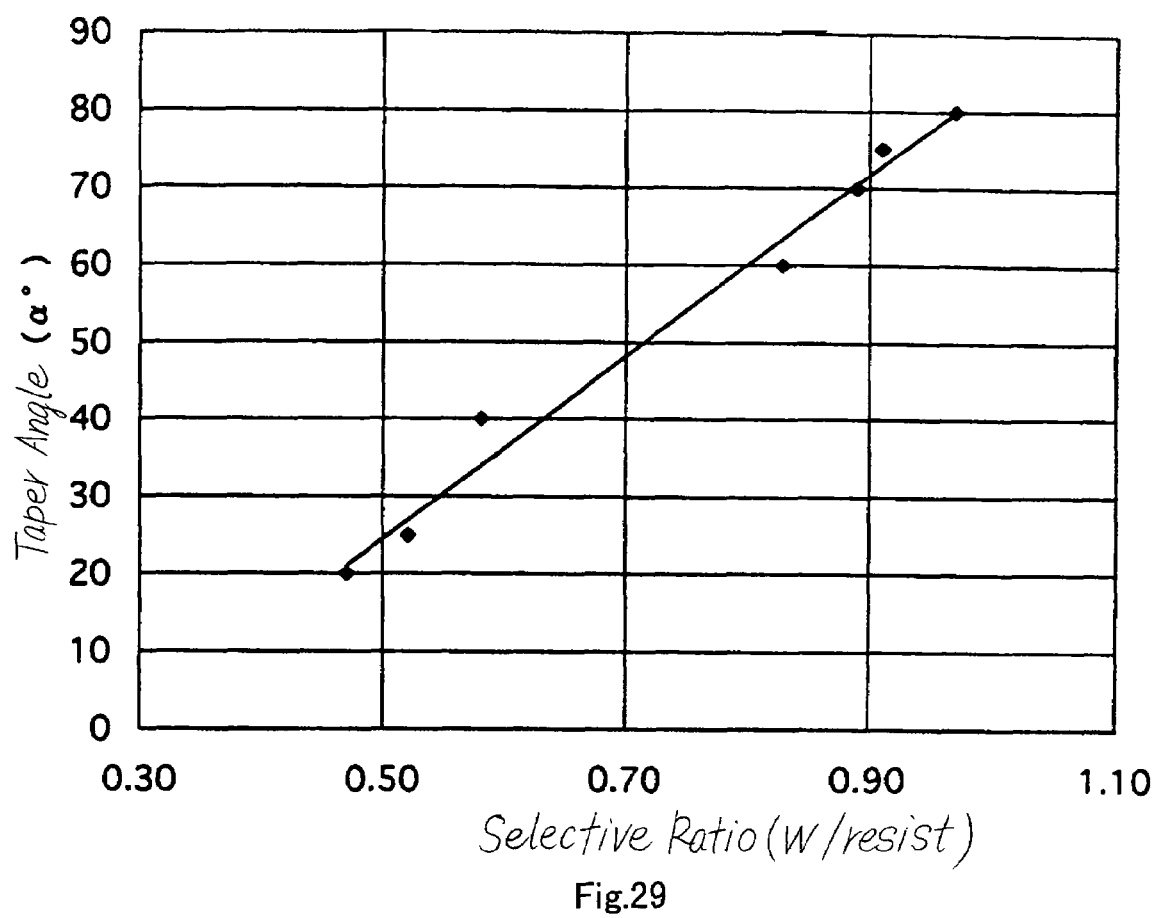
FIG. 29 is a diagram showing a dependency of a taper angle $\theta$ on the selective ratio of tungsten to resist (W/resist)
Figure 30:
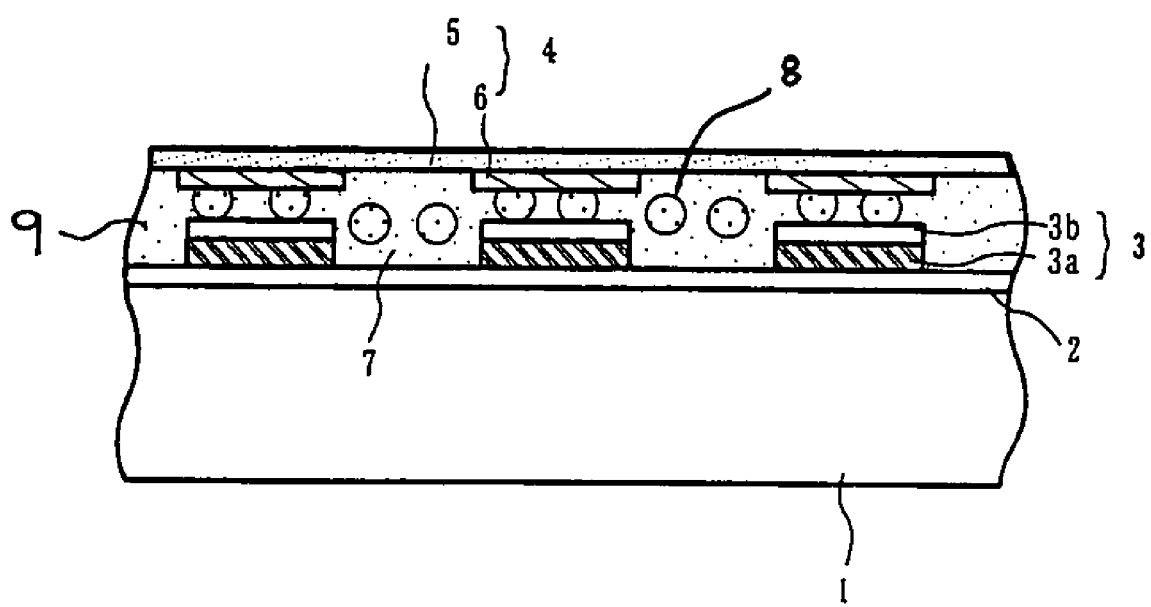
FIG. 30 is a diagram showing a conventional contact structure of a terminal portion of an active matrix substrate and an anisotropic conductive film.

Further, it is deemed that the taper angle θ depends on the selectivity of the etching of tungsten and resist. FIG. 29 is a diagram showing the dependency of the taper angle θ on the selective ratio of tungsten and resist. Using the ICP etching device in such a way, when the bias power density and the ratio of the quantity of flow of reaction gas are appropriately determined, it is possible to very easily form a wiring with a desired taper angle θ of between 3° and 60°.

In addition, the processing characteristics of the ICP etching device for the heat-resistant conductive materials is taken into consideration. Besides a W film and a Ta film, regarding a molybdenum-tungsten (Mo—W) alloy (composition ratio is Mo:W=48:50 wt %) that is often used as the material for the gate electrode, a typical value of an etching speed, an applicable etching gas, and a selective ratio to a gate insulating film that becomes the base of the gate electrode are shown here. The gate insulating film is a silicon oxide film or a silicon nitride oxide film formed with plasma CVD. The selective ratio here is defined as the ratio of the etching speed of the gate insulating film to the etching speed of each material.

TABLE 1

| Material | Etching speed (nm/min) | Selective ratio with the gate insulating film | |
|---|---|---|---|
| Ta | 140-160 | 6-8 | CF$_4$ + Cl$_2$ Cl$_2$ |
| Mo-W | 40-60 | 0.1-2 | CF$_4$ + Cl$_2$ |

The etching speed of the Ta film is between 140 and 160 nm/min, and the selective ratio of etching to the gate insulating film is between 6 and 8. This value surpasses the value of the selective ratio between 2 and 4 of the W film to the gate insulating film when the etching speed of the W film in the range of 70 to 90 nm/min. Therefore, the Ta film is also applicable from the viewpoint of the characteristic of the workability. Although not shown in the table, the resistivity of the Ta film is between 2° and 30 μΩcm, compared with the resistivity of the W film which is between 10 and 16 μΩcm, the Ta film resistivity is relatively higher and resulting into a difficult point.

On the other hand, the etching speed of the Mo—W alloy is slow and between 40° and 60 nm/min, its selective ratio of etching to the gate insulating film is between 0.1 and 2. It can be seen from the viewpoint of the characteristic of the workability that this material is not necessarily applicable. As can be known from table 1, the Ta film shows the best results. However, as stated above, when the resistivity is taken into consideration, then it is deemed that the W film is suitable after considering all the factors.

Further, as the etching gas for dry etching, mixed gas of gas containing fluorine and gas containing chlorine may be used. Gas selected from CF$_4$, CF$_6$, and C$_4$F$_8$ may be used as the gas containing fluorine, and gas selected from Cl$_2$Cl$_2$, SiCl$_4$, and BCl$_4$ may be used as the gas containing chlorine.

Embodiment 1

This Embodiment relates to an active matrix type liquid crystal panel. FIG. 1A is a diagram showing the top view of the active matrix substrate of this Embodiment in which a pixel portion and a driver circuit for driving the thin film transistor of the pixel portion are formed thereon, and also shows the positional relationship between a column-shape spacer formed on the active matrix substrate and a sealing agent.

As shown in FIG. 1A, on a glass substrate 101, there are provided a pixel portion 188 disposed with a thin film transistor, a scanning signal driver circuit 185, and an image signal driver circuit 186a as the driver circuit for driving the thin film transistor disposed in the pixel portion. In addition, a signal processing circuit 187 such as a CPU or a memory circuit is provided.

In the pixel portion 188, a gate wiring 189 extending from the scanning signal driver circuit 185 and a source wiring 190 extending from the image signal driver circuit 186a intersect into a matrix shape to form pixels. Each pixel is provided with a pixel TFT 204 and a storage capacitor 205 as shown in FIG. 6A.

A column-shape spacer 172, a cylindrical structured object made of resin, is for maintaining a space between the active matrix substrate and an opposing substrate. The column-shape spacer 172 to be provided in the pixel portion 188 may be provided not only to each pixel, but also to every several pixels or several tens of the pixels arranged in a matrix shape. In other words, the ratio of the total number of pixels composing the pixel portion to the number of spacers is good between 20% and 100%. In addition, driver circuits 185 to 187 may be provided with resin covering the entire surface of the circuits, instead of the column-shape spacer 172. The cylindrical spacer is provided in accordance with the position of the source wiring and the drain wiring of the TFT in this embodiment.

On the substrate 101, the sealing agent 186 is formed on the exterior of the pixel portion 188, the scanning signal driver circuit 185, the image signal driver circuit 186, and the signal processing circuit 187 of the other circuits, and on the interior of an external input/output terminal 182.

Figure 1B:
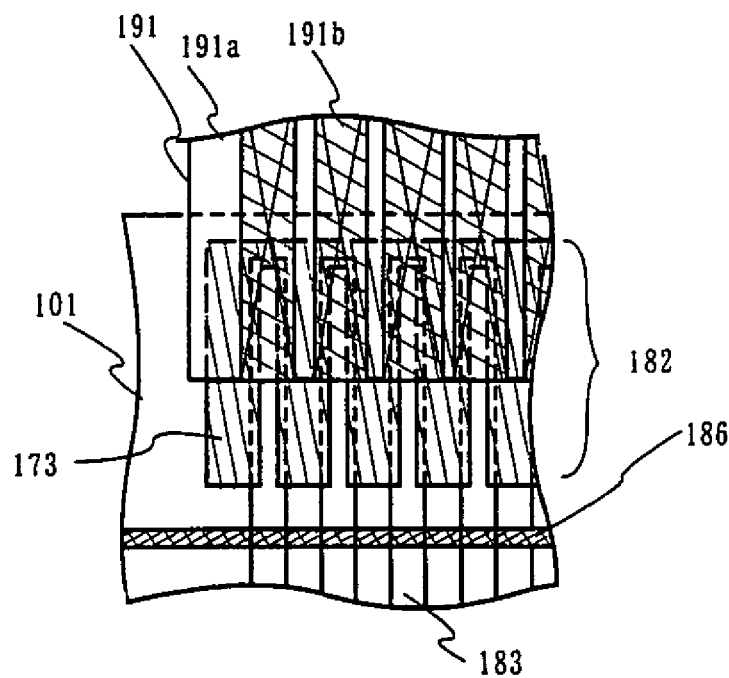

The driver circuits 185 to 187 on the active matrix substrate 101 are electrically connected to an external power source or an external circuit by the connecting wiring 183. The connecting wiring 183 is formed at the same time with the source (drain) wiring of the TFT of the driver circuits 185 to 187. The terminal portion 182 is integrally formed with the connecting wiring 183, and becomes a connecting portion with the wiring on the other substrate. FIG. 1B shows the partial enlarged view of the terminal portion 182.

As shown in FIG. 1B, the side surface of the terminal portion 182 is covered with a protecting film 173. The connecting wiring 183 in the terminal portion 182 is electrically connected to a wiring 191b of the FPC 191 by the anisotropic conductive film. The reference numeral 191a denotes the substrate that is provided with the FPC 191.

Figure 2:
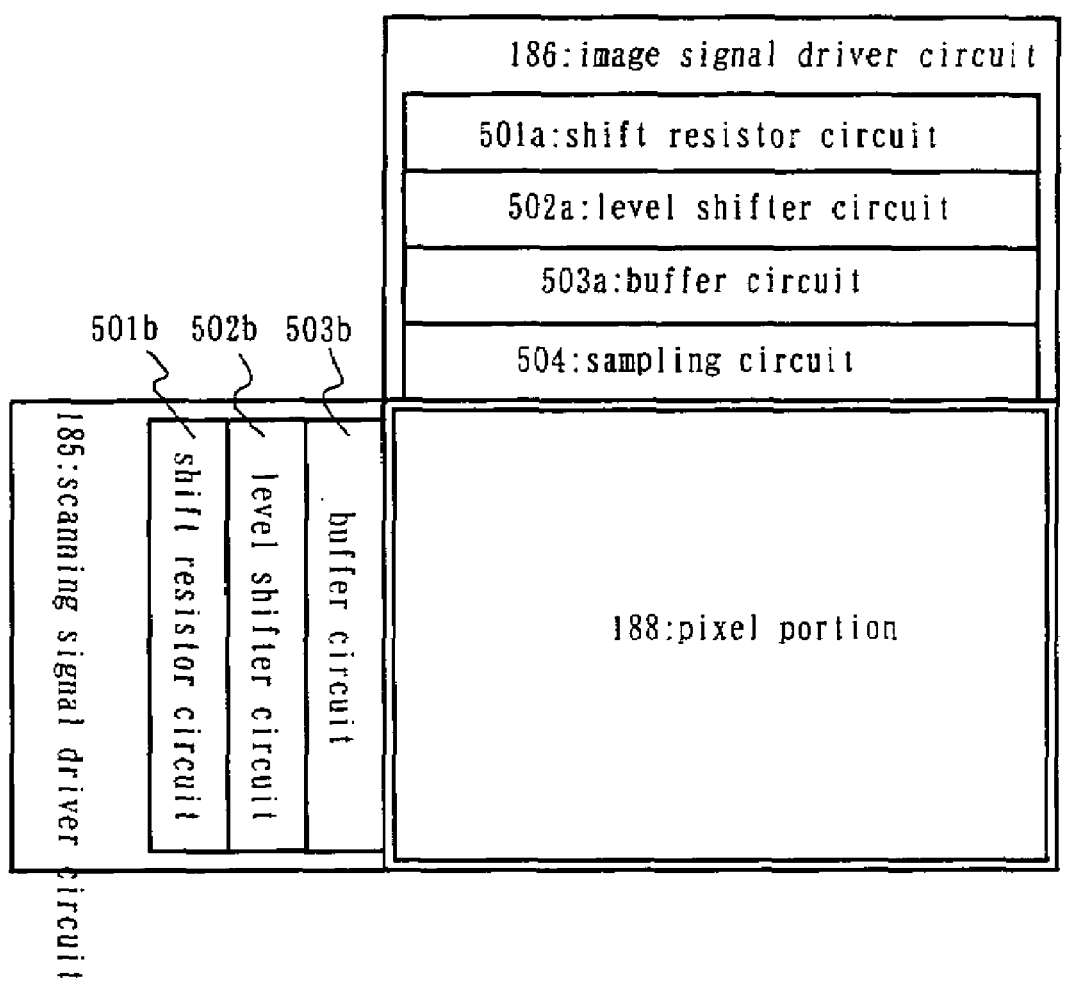
FIG. 2 is a block diagram for explaining a circuit structure of a liquid crystal display device.

FIG. 2 is a block diagram showing the circuit of the active matrix substrate 101. The image signal driver circuit 186 is composed of a shift resistor circuit 501a, a level shifter circuit 502a, a buffer circuit 503a, and a sampling circuit 504. In addition, the scanning signal driver circuit 185 is composed of a shift resistor circuit 501b, a level shifter circuit 502b, and a buffer circuit 503b.

The driving voltages of the shift resistor circuits 501a and 501b are between 5 and 16V (typically 10V). A CMOS circuit forming this circuit is formed of a first p-channel TFT 200 and a first n-channel TFT 201 as shown in FIG. 6. Though the driving voltage of the level shifter circuits 502a and 502b and the buffer circuits 503a and 503b become higher, between 14 and 16V, a TFT identical with that of the shift resistor may be used. Moreover, it is effective to form the gates in these circuits into a multi-gate structure to thereby raise pressure-resistance and improve reliability.

The sampling circuit 504 is formed from an analog switch and its driving voltage is between 14 to 16V. Since the polarity alternately reverses to be driven and there is a necessity to reduce an off current value, it is desired that the sampling circuit 504 be formed of a second p-channel TFT 202 and a second n-channel TFT 203 as shown in FIG. 6. When the off current value of the p-channel TFT 202 becomes a problem, a single drain structured TFT provided with an offset region formed in a process that will be shown in Embodiment 2, may be used to form this circuit.

Further, the driving voltage of the pixel portion is between 14 and 16 V. From a viewpoint of reducing power consumption, there is a demand to further reduce the off current value of the pixel portion than that of the sampling circuit. Accordingly, it is desired that the pixel portion be a multi-gate structure as a pixel TFT 204 shown in FIG. 6, and additionally be a structure provided with an LDD region.

Note that only the block structures of the pixel portion 188 and the driver circuits 185 and 186 have been shown. Other circuits such as a signal distributing circuit, a frequency dividing circuit, a D/A converter, a $\gamma$-correction circuit, an op-amp circuit, and further signal processing circuits 187 such as a memory circuit and an arithmetic operation circuit, and still further a logical circuit, may all be formed on the same substrate in accordance with the process of the TFT which will be explained later. According to the present invention, a semiconductor device having the pixel portion and the driver circuits formed on the same substrate, for example, a liquid crystal display device provided with the signal driver circuit and the pixel portion can be realized.

Hereinafter, a process of manufacturing an active matrix substrate will be explained. FIGS. 3A to 7 are sectional views showing the manufacturing process of the pixel portion 188 and the driver circuits. FIGS. 9A to 11C are diagrams showing a manufacturing process of the terminal portion 182 of the connecting wiring 183. The same reference numerals in these diagrams denote the same constituents.

A barium borosilicate glass or aluminoborosilicate glass as typified by Corning #7059 glass and #1737 glass can be used for a substrate 101. Besides these glass substrates, plastic substrates not having optical anisotropy such as polyethylene terephthalate (PET), polyethylene naphthalate (PEN), polyethersulfone (PES), etc, can be used, too. In the case of using a glass substrate, the substrate may be heat-treated in advance at a temperature lower by about 10 to 20° C. than a glass strain point. A base film 102 comprising such as a silicon oxide film, a silicon nitride film or a silicon oxynitride film is formed over the surface of the substrate 101, on which TFT is to be formed, in order to prevent the diffusion of impurities from the substrate 101. For example, a laminate of the silicon oxynitride film 102a formed from $SiH_4$, $NH_3$ and $N_2O$ by plasma CVD to a thickness of 10 to 200 nm (preferably, 50 to 100 nm) and a hydrogenated silicon oxide nitride film 102b formed similarly from $SiH_4$ and $N_2O$ to a thickness of 50 to 200 nm (preferably, 100 to 150 nm), is formed. (FIG. 3A)

The silicon oxynitride film is formed by using the conventional parallel plate type plasma-enhanced CVD. The silicon oxynitride film 102a is formed by introducing $SiH_4$ at 10 sccm, $NH_3$ at 100 sccm and $N_2O$ at 20 sccm into a reaction chamber under the condition of a substrate temperature of 325° C., a reaction pressure of 40 Pa, a discharge power density of 0.41 W/cm² and a discharge frequency of 60 MHz. These films can be formed by only changing the substrate temperature and by switching the reactive gases.

The silicon oxynitride film 102a thus formed has a density of $9.28 \times 10^{22}/cm^3$, has a slow etching rate of about 63 nm/min in a mixed solution ("LAL500", a product of Stella Chemifa Co.) containing 7.13% of ammonium hydrogenfluoride ($NH_4HF_2$) and 15.4% of ammonium fluoride ($NH_4F$) at 20° C., and is a compact and hard film. When such a film is used for the base film, the diffusion of alkali metal elements from the glass substrate into the semiconductor layers formed thereon can be effectively prevented.

Next, a semiconductor film 103a having a thickness of 25 to 80 nm (preferably, 30 to 60 nm) and an amorphous structure is formed by a known method such as plasma CVD or sputtering. For example, an amorphous silicon film is formed to a thickness of 55 nm by plasma CVD. Semiconductor films having such an amorphous structure include an amorphous semiconductor film and a micro-crystalline semiconductor film, and a compound semiconductor film having an amorphous structure such as an amorphous silicon-germanium film may also be used. Both the base film 102 and the amorphous semiconductor layer 103a can be formed continuously. For example, after the silicon oxynitride film 102a and the hydrogenated silicon oxynitride film 102b are formed continuously by the plasma CVD process as described above, the deposition can be carried out continuously by switching the reactive gases from $SiH_4$, $N_2O$ and $H_2$ to $SiH_4$ and $H_2$, or $SiH_4$ alone, without exposing to the atmosphere of the open air. As a result, the contamination of the surface of the hydrogenated silicon oxynitride film 102b can be prevented, and variance of the characteristics of the TFT to be fabricated and fluctuation of the threshold voltage can be reduced.

The crystallization step is then carried out to form a crystalline semiconductor film 103b from the amorphous semiconductor film 103a. A laser annealing method, a thermal annealing method (solid phase growth method) or a rapid thermal annealing method (RTA) method can be used for this method. In the case of using the glass substrate or the plastic substrate having a low heat resistance, the laser annealing method is employed preferably. The RTA method uses an IR lamp, a halogen lamp, a metal halide lamp or a xenon lamp as the light source. Alternatively, the crystalline semiconductor film 103b can be formed by the crystallization method using a catalytic element in accordance with the technology disclosed in Japanese Patent Application Laid-Open No. Hei 7-130652. In the crystallization step, hydrogen contained in the amorphous semiconductor film is first discharged preferably. After heat-treatment is conducted at 400 to 500° C. for about 1 hour to lower the hydrogen content to 5 atom % or below, the crystallization step is then conducted. In this way, roughness of the film surface can be prevented advantageously.

When the crystallization step is conducted by the laser annealing method, a pulse oscillation type or continuous light emission type excimer laser, or an argon laser is used as the light source. In the case of using the pulse oscillation type excimer laser, the laser beam is processed to a linear shape and laser annealing is then conducted. The laser annealing condition may be selected appropriately by the operator, for example, the laser pulse oscillation is set at 30 Hz and the laser energy density is 100 to 500 mJ/cm$^2$ (typically, 300 to 400 mJ/cm$^2$). The linear beams are irradiated to the entire surface of the substrate, and the overlap ratio of the linear beams at this time is 80 to 98%. In this way, the crystalline semiconductor film 103$b$ can be obtained as shown in FIG. 3B.

A resist pattern is formed on the crystalline semiconductor film 103$b$ by photolithography that uses a photo-mask PM1. The crystalline semiconductor film is divided into islands by dry etching, forming thereby island semiconductor films 104 to 108. A mixed gas of CF$_4$ and O$_2$ is used for dry etching.

An impurity imparting p-type may be added in a concentration of about $1 \times 10^{16}$ to $5 \times 10^{17}$ atoms/cm$^3$ to the entire surface of the island semiconductor films in order to control the threshold voltage (Vth) of the TFT. The elements of the Group XIII of the Periodic Table such as boron (B), aluminum (Al) or gallium (Ga) are known as the impurity elements for imparting p-type to the semiconductor. Ion implantation or ion doping can be adopted as the method of doping these elements, but ion doping is suitable for processing a substrate having a large area. This ion doping method uses diborane (B$_2$H$_6$) as a source gas and adds boron (B). Addition of such an impurity element is not always necessary and may be omitted. However, this is the method that can be used appropriately for keeping the threshold voltage of the n-channel TFT, in particular, within a prescribed range.

A gate insulating film 109 is formed from an insulating film containing silicon to a thickness of 40 to 150 nm by plasma CVD or sputtering. For example, it may be formed from a silicon oxynitride film having a thickness of 120 nm. The silicon oxynitride film that is formed by adding O$_2$ to SiH$_4$ and N$_2$O has a reduced fixed charge density in the film and is a preferable material for this application. Needless to say, the gate insulating film is not particularly limited to such a silicon oxynitride film but may be a single layered structure of other insulating film containing silicon or their laminate structure. (FIG. 3C)

A conductive film is formed as shown in FIG. 3D to form a gate wiring on the gate insulating film 109. The conductive film may comprise a single layer, but may be a laminate structure of plurality of layers such as double layer or triple layer, if necessary. For example, in the case it is a double layer structure, the upper film is formed from a metal film comprising an element selected from tantalum (Ta), titanium (Ti), molybdenum (Mo) and tungsten (W), etc. as the principle component or alloy films comprising these elements (typically, a Mo—W alloy film, an Mo—Ta alloy film), and the lower film is formed from tantalum nitride (TaN), tungsten nitride (WN), titanium nitride (TiN), molybdenum nitride (MoN), etc. For example, in the case of double layer, the upper film may be formed from a nitride of the conductive lower film, when it is denoted like lower/upper, they may be WN film/W film or TaN film/Ta film, or the like. In the case of a triple layer, it may be TaN film/Ta film/TaN film. It is preferable to set the resistivity of the second (upper) conductive film within a range of 10 to 50 mWcm. The impurity concentration contained may be preferably reduced for low resistance, specifically the oxygen concentration may be reduced to 30 ppm or below. For example, resistivity of 20 mWcm or below can be realized with respect to tungsten (W) by setting the oxygen concentration at 30 ppm or below.

Further, it is preferable to use a film having aluminum as its principle component for achieving low resistivity of the wiring. In this case, the heat resistance may be enhanced by adding trace amount of Si or Sc or the like into aluminum. For example, as a conductive film which forms a gate wiring, Ti film/Al film added with Sc or Ti film/TiN film/Al film added with Sc may be formed.

In the case of using W for the gate electrode, tungsten nitride (WN) is formed to a thickness of 50 nm for the conductive layer 111 by sputtering using W as a target and by introducing an argon (Ar) gas and a nitrogen (N$_2$) gas, and W is formed to a thickness of 250 nm for the conductive layer 110. As another method, W film can be formed by thermal CVD using tungsten hexafluoride (WF$_6$). In any case, the resistance of the gate electrode must be lowered, and the resistivity of the W film is preferably not higher than 20 mWcm. The low resistivity of the W film can be accomplished by increasing the crystal grain size, but the resistivity becomes high when the contents of the impurity elements such as O in W are great because crystallization is impeded. Therefore, when sputtering is employed, the W target used has a purity of 99.9999%, and sufficient attention should be paid lest impurities mix from the gaseous phase during the formation of the film. In this way, the resistivity of 9 to 20 mWcm can be achieved.

It is possible to form TaN film and Ta film similarly by sputtering. To form the TaN film, Ta is used as the target and a mixed gas of Ar and nitrogen, as the sputtering gas. Argon (Ar) is used as the sputtering gas to form the Ta film. When a suitable amount of Xe or Kr is added to the sputtering gas, the internal stress of the resulting films can be mitigated and peel of the films can be prevented. The resistivity of the $\alpha$ phase Ta film is about 20 mWcm, and this film can be used for the gate electrode. However, the resistivity of the $\beta$ phase Ta film is about 180 mWcm and this film is not suitable for the gate electrode. The TaN film has a crystal structure approximate to that of the $\alpha$ phase. Therefore, when the Ta film is formed on the TaN film, the $\alpha$ phase Ta film can be obtained easily. In the present Embodiment, TaN film is deposited as the lower conductive film 110, and Ta, as the upper conductive film 111, which form the gate wiring.

Incidentally, it is effective to form a phosphorus (P) doped silicon film to a thickness of about 2 to about 20 nm between the conductive film which forms the gate wiring and the gate insulating film 109. By doing so, the improvement of adhesiveness and prevention of oxidation of the conductive film formed thereon can be devised and at the same time it is possible to prevent the alkali metal elements contained in the conductive film in a trace amount to diffuse into the gate insulating film 109.

Next, resist masks RM1 to RM6 are formed by photolithography by using a photo-mask PM2. The conductive layer 110 and the conductive layer 111 are collectively etched to form gate electrodes 118 to 122 and a capacitance wiring 123. These gate electrodes 118 to 122 and capacitance wiring 123 comprise a unitary structure of 118$a$ to 122$a$ formed of a conductive film and 118$b$ to 123$b$ formed of a conductive film. (FIG. 4A)

To form an LDD region in the n-channel TFT, a doping step of an impurity element for imparting the n type (n$^-$ doping step) is conducted. Here, the impurity element imparting n-type is doped by ion-doping by self-alignment with the gate electrodes 118 to 122 as the mask. Phosphorus (P) is doped as the impurity element imparting n-type within the range of $1 \times 10^{16}$ to $5 \times 10^{19}$ atoms/cm$^3$. In this way, the low concentration n-type impurity regions 124 to 129 are formed in the island-like semiconductor films as shown in FIG. 4B.

Next, formation of high concentration n-type impurity region that functions as a source or a drain region in the n-channel TFT, is conducted (n⁺ doping step). First, resist masks RM8 to RM12 are formed using a photo-mask PM3, and an impurity element imparting n-type is doped to form high concentration n-type impurity regions 130 to 135. Phosphorus (P) is used as the impurity element imparting n-type. Ion doping using phosphine ($PH_3$) is employed so that the concentration falls within the range of $1\times10^{20}$ to $1\times10^{21}$ atoms/cm³ (FIG. 4C).

High concentration p-type impurity regions 136 and 137 are formed as the source and drain regions in the island-like semiconductor films 104 and 106 forming the p-channel TFT. Here, an impurity element imparting p-type is doped with the gate electrodes 118 and 120 as the mask, and the high concentration p-type impurity regions are formed by self-alignment.

At this time, resist masks RM13 to RM15 are formed on the island-like semiconductor films 105, 107 and 108 forming the n-channel TFTs by using a photo-mask PM4 to cover the entire surface. High concentration p-type impurity regions 136 and 137 are formed by ion doping that uses diborane ($B_2H_6$). The boron (B) concentration in the regions is $3\times10^{20}$ to $3\times10^{21}$ atoms/cm³ (FIG. 4D).

Phosphorus (P) is added to the high concentration p-type impurity regions 136 and 137 in a preceding step, in a concentration of $1\times10^{20}$ to $1\times10^{21}$ atoms/cm³ with respect to the high concentration p-type impurity regions 136a and 137a, and in a concentration of $1\times10^{16}$ to $5\times10^{19}$ atoms/cm³ with respect to the high concentration p-type impurity regions 136b and 137b. However, by setting the concentration of boron (B) added in this step to become 1.5 to 3 times higher, no trouble occurs in the function as the source and drain regions of the p-channel TFT.

Thereafter, as shown in FIG. 5A, a protective insulating film 138 is formed from above the gate wiring and the gate insulating film. The protective insulating film 138 may comprise a silicon oxide film, a silicon oxynitride film, a silicon nitride film or a laminate film comprising the combination of these films. In any case, the protective insulating film 138 is formed of an inorganic insulating material. The protective insulating film 138 has a film thickness of 100 to 200 nm. When the silicon oxide film is used, tetraethyl orthosilicate (TEOS) and $O_2$ are mixed, and the film can be formed by plasma CVD with a reaction pressure of 40 Pa, a substrate temperature of 300 to 400° C. and plasma is discharged at a high frequency (13.56 MHz) power density of 0.5 to 0.8 W/cm².

When the silicon oxynitride film is used, the film may comprise a silicon oxynitride film formed by plasma CVD from $SiH_4$, $N_2O$ and $NH_3$ or a silicon oxynitride film formed from $SiH_4$ and $N_2O$. The film deposition condition in this case is the reaction pressure of 20 to 200 Pa, the substrate temperature of 300 to 400° C., and the high frequency (60 MHz) power density of 0.1 to 1.0 W/cm². The hydrogenated silicon oxynitride film formed from $SiH_4$, $N_2O$ and $H_2$ may be used, as well. The silicon nitride film can be formed similarly from $SiH_4$ and $NH_3$ by plasma CVD.

Thereafter, the step of activating the impurity elements imparting n-type or p-type added in the respective concentrations is conducted. This step is conducted by a thermal annealing method using a furnace annealing oven. Besides the thermal annealing method, it is possible to employ a laser annealing method and a rapid thermal annealing method (RTA method). The thermal annealing method is conducted in a nitrogen atmosphere containing oxygen in a concentration of 1 ppm or below, preferably 0.1 ppm or below, at 400 to 700° C., typically 500 to 600° C. In this embodiment, the heat-treatment is conducted at 550° C. for 4 hours. When a plastic substrate having a low heat-resistant temperature is used for the substrate 101, the laser annealing method is preferably employed (FIG. 5B).

After the activation step, heat-treatment is further conducted in an atmosphere containing 3 to 100% hydrogen at 300 to 450° C. for 1 to 12 hours to hydrogenate the island-like semiconductor film. This is the process step that terminates the dangling bonds of $10^{16}$ to $10^{18}$/cm³ in the island-like semiconductor film by hydrogen that is thermally excited. Plasma hydrogenation (using hydrogen that is excited by plasma) may be used as another means for hydrogenation.

After the activation and hydrogenation steps are completed, an interlayer insulating film 139 made of an organic insulating material is formed to a mean thickness of 1.0 to 2.0 mm. Examples of the organic resin materials are polyimide, acrylic, polyamide, polyimidamide, BCB (benzocyclobutene), and so forth. When polyimide of the type, that is thermally polymerized after being applied to the substrate, is used, the material is baked at 300° C. in a clean oven. When acrylic is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes. (FIG. 5C)

By forming the interlayer insulating film 139 from an organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulating material must be used in combination with the silicon oxide film, the silicon oxynitride film or the silicon nitride film formed as the protective insulating film 138 as in this embodiment.

Thereafter, a resist mask having a predetermined pattern is formed by using a photomask PM5 (FIG. 6A). Contact holes reaching the source or drain regions of the respective island-like semiconductor films are formed in the insulating films 138 and 139. Further, insulating films 138 and 139 are removed from the terminal section 182. The contact holes are formed by dry etching. In this case, a mixed gas of $CF_4$, $O_2$ and He is used as the etching gas. The interlayer insulating film 139 formed of the organic resin material is first etched. Then, the etching gas is switched to $CF_4$ and $O_2$, and the protective insulating film 138 is etched. To improve the selection ratio with the island-like semiconductor films, the etching gas is switched further to $CHF_3$ and the gate insulating film is etched. In this way, the contact holes can be formed satisfactorily.

A laminate film of a metal film 140 which forms a source/drain wiring and connection wiring 183 and a transparent conductive film 141 is formed. Here Ti film is formed to a thickness of 50 to 150 nm as the metal film 140, which is brought to form contact with the semiconductor film that form the source region or the drain region, and aluminum (Al) is formed into a thickness of 300 to 400 nm by sputtering to overlap the Ti film. Further, a laminate film comprising Ti film/TiN film/Al film may be formed as the metal film 140.

The material of transparent conductive film can be formed from indium oxide ($In_2O_3$) or an alloy of indium oxide and tin oxide ($In_2O_3$—$SnO_2$; ITO) by sputtering or vacuum evaporation. The etching treatment of these materials is performed by solution including hydrochloric acid. However, since residues are easily generated specifically in the etching of ITO, the alloy of indium oxide and zinc oxide (In$_2$O$_3$—ZnO$_2$) may be used in order to improve etching workability. The alloy of indium oxide and zinc oxide has superiority in the surface smoothness and in thermal stability compared to ITO, and it can prevent corrosion reaction with Al which will be in contact at the edge surface of the drain wiring 169. Similarly zinc oxide (ZnO) is also an appropriate material, and a zinc oxide added with gallium (ZnO:Ga) for the purpose of increasing transmittivity of visible rays and conductivity or the like can also be used. In the present embodiment alloy of indium oxide and zinc oxide is formed as the transparent conductive film 141.

Figures 9A, 9B, 9C:
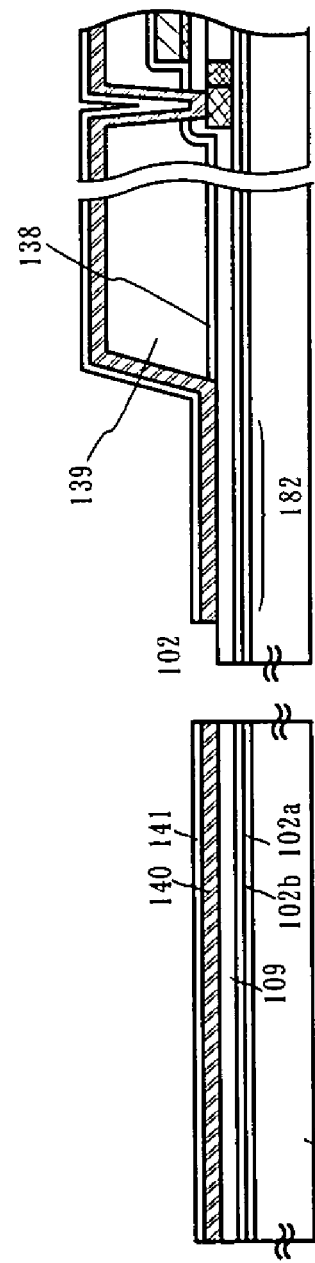
FIGS. 9A to 9C are sectional views showing a manufacturing process of a terminal portion of a connecting wiring.

FIGS. 9A to 9C show the structure in the terminal section 182 of connection wiring 183 which corresponds to FIG. 6A. FIG. 9A corresponds to a cross section vertical to the longitude direction of the wiring, FIG. 9B corresponds to a cross direction along the longitude direction and they are made to clearly show structure with respect to the TFT and the laminate relations. FIG. 9C is a top view. FIGS. 10A to 11C are similar to these.

A resist mask pattern is then formed by using a photo-mask PM6. Source wirings 148 to 152 and drain wirings 153 to 158 are formed by etching, and connection wiring 183 is formed as shown in FIG. 10. Here, the drain wiring 157 functions as the pixel electrode. (FIGS. 6B and 10A to 10C)

When the hydrogenation treatment is conducted under this state, favorable results can be obtained for the improvement of TFT performance. For example, the heat-treatment may be conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulating film 138 and the base film 102 into the island-like semiconductor films 104 to 108 and can hydrogenate these films. In any case, the defect density in the island-like semiconductor films 104 to 108 is lowered preferably to 10$^{16}$/cm$^3$ or below, and for this purpose, hydrogen may be added in an amount of about 0.01 to about 0.1 atomic %.

When the six photo-masks are used as described above, a substrate having the TFTs of the driving circuit and the pixel TFTs of the pixel portion over the same substrate can be completed. The first p-channel TFT 200, the first n-channel TFT 201, the second p-channel TFT 202 and the second n-channel TFT 203 are formed in the driving circuit. The pixel TFT 204 and the storage capacitance 205 are formed in the pixel portion. In this specification, such a substrate will be referred to as an "active matrix substrate" for convenience sake.

The first p-channel TFT 200 in the driving circuit has a single drain structure that comprises in the island-like semiconductor film 104: the channel formation region 206; and the source regions 207a and 207b and the drain regions 208a and 208b each comprising the high concentration p-type impurity region.

In the island-like semiconductor film 105 of the first n-channel TFT 201, there are formed: the channel formation region 209; the LDD region 210 that does not overlap with the gate electrode 119; the source region 212; and the drain region 211. The length of this LDD region 210 in the direction of the channel length is 1.0 to 4.0 mm, preferably 2.0 to 3.0 mm. As the length of the LDD region in the n-channel TFT is determined in this way, a high electric field occurring in the proximity of the drain region can be mitigated, and the occurrence of hot carriers and degradation of the TFT can be prevented.

The second p-channel TFT 202 of the sampling circuit has the single drain structure in which the channel formation region 213, the source regions 214a and 214b and the drain regions 215a and 215b comprising the high concentration p-type impurity region are formed in the island-like semiconductor film 106.

A channel formation region 216, LDD regions 217 and 218, a source region 220 and a drain region 219 are formed in the island semiconductor film 107 of the second n-channel TFT 203. The length of the LDD regions 217 and 218 is set at between 1.0 and 4.0 mm.

The channel forming regions 221 and 222, LDD regions 223 to 225, source or drain regions 226 to 228 are formed in the island-like semiconductor film 108 of the pixel TFT 204. The length of the LDD region in the direction of the channel length is 0.5 to 4.0 mm, preferably 1.5 to 2.5 mm. Furthermore, a storage capacitor is connected to the pixel TFT 204. The storage capacitance 205 is a capacitance which has the gate insulating film 209 as a dielectric, and capacitance wiring 123 and the semiconductor film 229 which is connected to the drain region 228 of the pixel TFT 204 as the electrodes. In FIG. 6B, the pixel TFT 204 is a double gate structure. However, it may have a single gate structure or a multi-gate structure having a plurality of gate electrodes.

Figure 13:
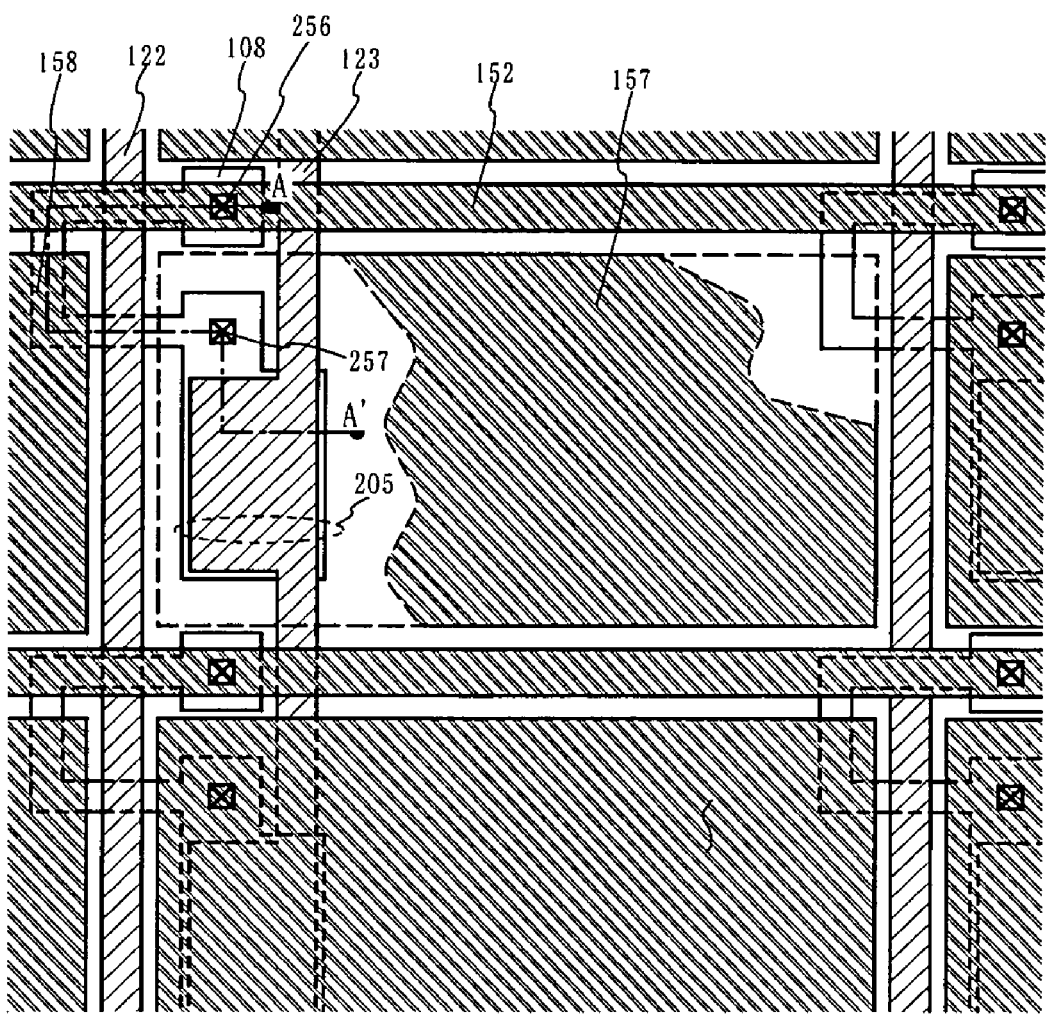
FIG. 13 is a diagram showing a top view of one pixel of a pixel portion.

FIG. 13 is a top view showing almost one pixel of the pixel portion. The cross section A-A' in the drawing corresponds to the sectional view of the pixel portion shown in FIG. 6B. The gate electrode 122 of the pixel TFT 204, that functions also the gate wiring, crosses the island-like semiconductor film 108 below it through a gate insulating film, not shown in the drawing. The source region, the drain region and the LDD region are formed in the island-like semiconductor film 108, though they are not shown in the drawing. Reference numeral 256 denotes a contact portion between the source wiring 152 and the source region 226. Reference numeral 257 denotes a contact portion between the drain wiring 157 and the drain region 228. A storage capacitance 205 is formed by the overlapping region of the semiconductor layer 229 that extends from the drain region 228 of the pixel TFT 204 and a capacitance wiring 123 through the gate insulating film. In this construction, an impurity element for valency control is not added to the semiconductor layer 229.

The construction described above makes it possible to optimize the structure of the TFT constituting each circuit in accordance with the specification required by the pixel TFT and the driving circuit, and to improve operation performance and reliability of the semiconductor device. Furthermore, this construction makes it easy to activate the LDD region, the source region and the drain region by forming the gate electrode by a conductive material having heat resistance.

Figure 7:
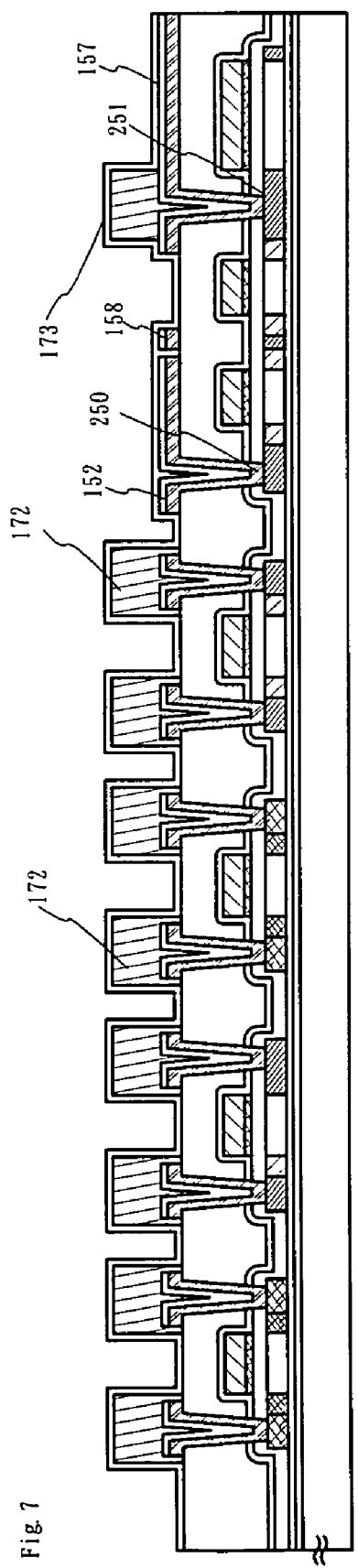
FIG. 7 is a sectional view showing a manufacturing process of an active matrix substrate.

Further in this embodiment columnar spacer 172 is formed, as shown in FIG. 7, on the active matrix substrate which went through the above described processes. At the same time, a protection film 174 which protects side face of the terminal section 182 of the connection wiring 183 is formed with the formation of the columnar spacer 172. The material of the columnar spacer 172 is not limited, in particular, and they may be formed by using, for example, "NN700" of JSR Co., and after the material is coated by a spinner, a prescribed pattern is formed by exposure and development. The pattern is then heated and cured at 150 to 200° C. in a clean oven or like oven or the like.

Figure 14:
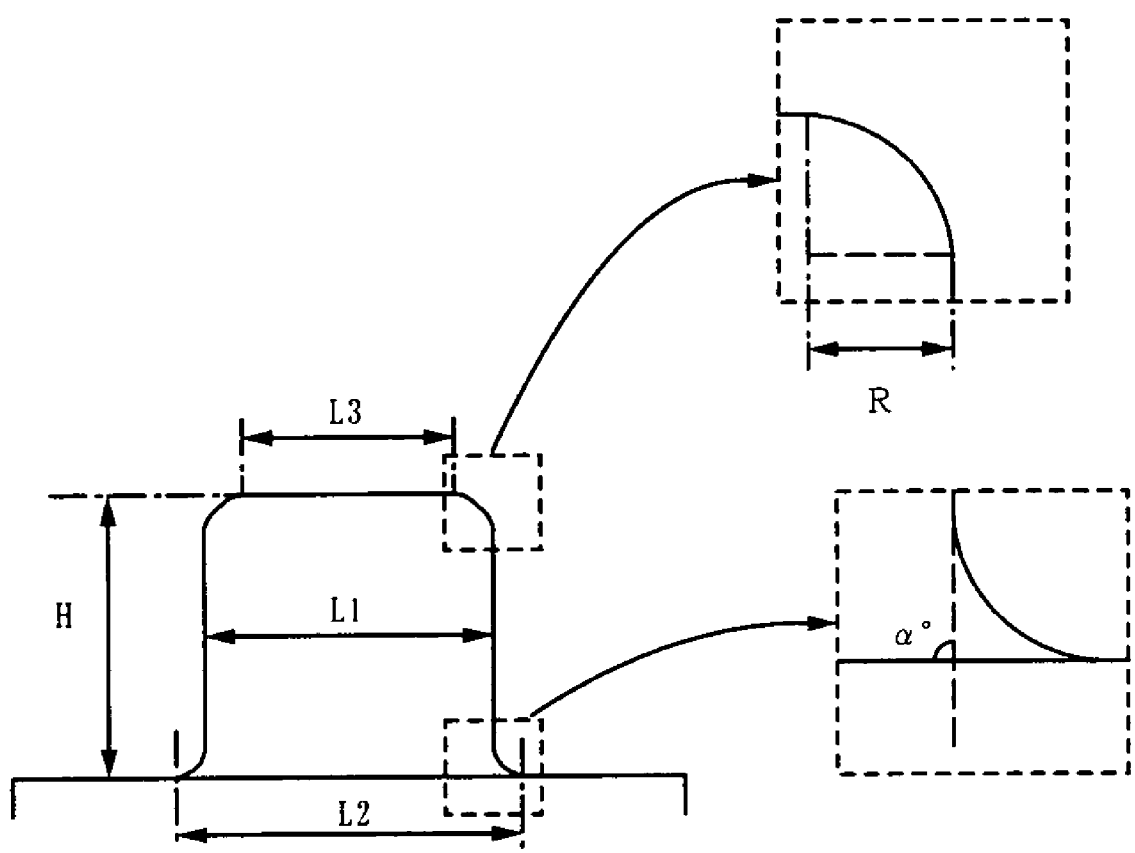
FIG. 14 is a diagram for explaining a shape of a column-shape spacer.

The shape of the spacer thus formed can be changed depending on the conditions of exposure and development. Preferably, however, the columnar spacer 172 has a columnar shape with a flat top as shown in FIG. 14, so that the mechanical strength as the liquid crystal display panel can be secured when the substrate on the opposite side is put. The shape is not particularly limited and may be conical or pyramidal. When it is conical, for example, the height H is 1.2 to 5 mm, the mean radius L1 is 5 to 7 mm and the ratio of the mean radius L1 to the radius L2 of the bottom is 1:1.5. The taper angle of the side surface is not greater than ±15° at this time.

The arrangement of the columnar spacer may be decided arbitrarily. Preferably, however, the columnar spacer 172 is disposed in such a manner as to be superposed with, and cover, the contact section 251 of the drain wiring 157 (pixel electrode) in the pixel section 188 as shown in FIG. 7. Since planarity at the contact section 251 is lost and the liquid crystal is not oriented well at this section, disclination, etc. can be prevented by forming the columnar spacer 172 in the form in which the spacer resin is filled to the contact section.

The protection film 174 which protects the side face of the connection wiring 183 is formed in the manufacturing process of the columnar spacer 172, as shown in FIG. 11. The protection film 174 is formed so as to expose only the surface of the transparent conductive film 141 in the terminal portion 182. The shape of the protection film 174 can be determined by the conditions of the exposure and development treatment. According to this structure, because the metal film 140 is in contact and covered with the protection film 174, gate insulating film 109 and transparent conductive film 141, it will not be exposed to open air.

Thereafter, the alignment film 173 is formed on the surface of the substrate 101. The alignment film 173 is not formed at the terminal section 182. A polyimide resin is used generally for the alignment film of the liquid crystal display element. After the alignment film is formed, rubbing treatment is conducted so that the liquid crystal molecules are oriented with a certain pre-tilt angle. The region from the end portion of the columnar spacer 172 disposed in the pixel section to the region that is not rubbed, in the rubbing direction is not greater than 2 mm. The occurrence of static electricity often becomes the problem during the rubbing treatment. When the spacer 172 is formed over the TFT of the driving circuit, too, both original role as the spacer and the protection effect of the TFT from static electricity can be acquired.

Thus an active matrix substrate in which the columnar spacer 172 which holds the distance between the substrates and the substrate 101 are integrated, is completed. Note that the structure can be made to form the columnar spacer 172 after forming the alignment film 173. (FIGS. 7 and 11A to 11C)

Figure 8:
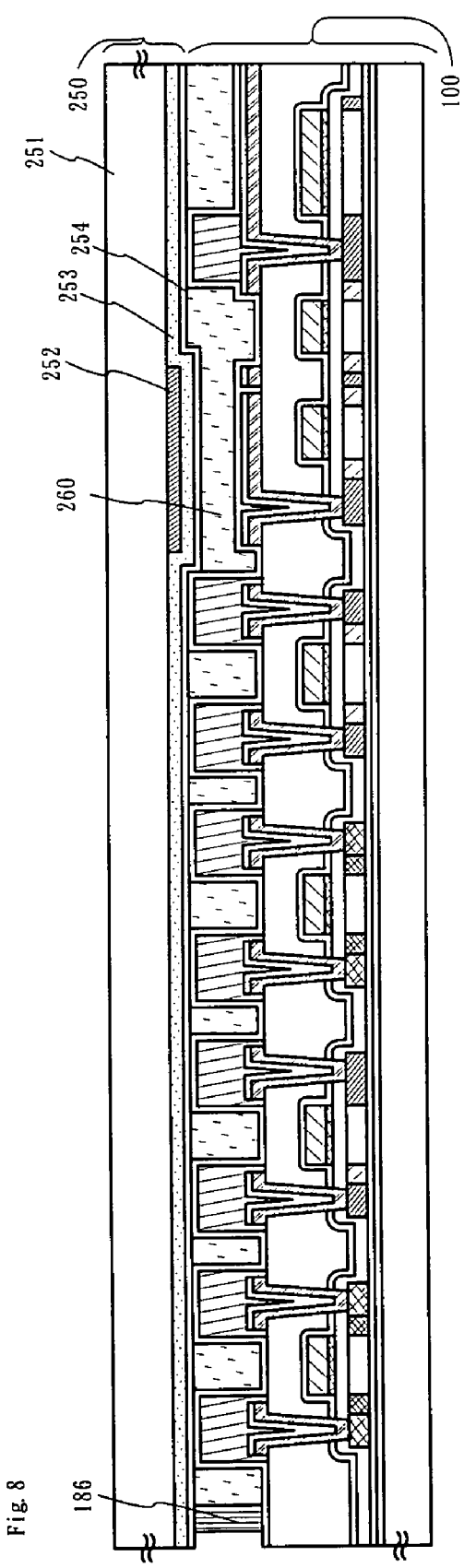
FIG. 8 is a diagram showing the sectional view of a liquid crystal panel.

A shielding film 252, a color filter not shown in the drawing, a transparent conductive film 253 and an alignment film 254 are formed over the substrate 251 as shown in FIG. 8, for the substrate which will be in pair with the active matrix substrate. Ti, Cr, Al and the like is formed to a thickness of 150 to 300 nm for the shielding film 252.

The active matrix substrate formed with the pixel section and the driver circuit as shown in FIG. 8 and the opposing substrate are then stuck together by the sealant 179. A filler is mixed into the sealant 179, and the two substrates are stuck together by holding a uniform distance by this filler and the columnar spacer 172. A liquid crystal material 260 is then injected in the clearance of the substrates, completely sealed by the sealant (not shown) and the liquid crystal panel is complete.

Further, in order to connect the circuits over the active matrix substrate 100 to the circuit for inputting image signal and the power supply for supplying electric power, or the like, the connection wiring 183 and the FPC 191 are electrically connected by anisotropic conductive film 195 in the terminal section 182, as shown in FIG. 12. FIG. 12A is a cross sectional view of the plane vertical to the longitude direction of the wiring of the terminal section 182 and FIG. 12B a cross section along the longitude direction.

As shown in FIGS. 12A and 12B, the anisotropic conductive film 195 comprises a grain 195b of several dozens to several hundreds mm plated with gold, chromium or the like, in the adhesive 195a. The active matrix substrate 100 and the FPC 191 can be electrically connected when the grain 195b contacts the connection wiring 183 and the wiring of the FPC 191b. In order to increase adhesive strength between the FPC 191 and the substrate 109, the FPC 191 is placed outside the external terminal section 182, resin layer 192 is disposed at the edge portion, and the mechanical strength is increased.

Embodiment 2

The connecting wiring 183 is formed in the same manufacturing process with a source/drain wiring of the TFT in Embodiment 1. In Embodiment 2, the connecting wiring 183 will be formed in the same process with a gate wiring. Embodiment 2 will be explained with reference to FIG. 15. The manufacturing process of the TFT will be employed from Embodiment 1. The reference numerals in FIG. 15 which are identical with those of FIGS. 3A to 8 denote the same constituents.

First the manufacturing processes until FIG. 9C are performed in accordance with those of Embodiment 1. Next, a lamination film of a conductive film 301 and a transparent conductive film 302 composing the gate wiring, are formed. The material for forming conductive films 110 and 111 composing the gate wiring in Embodiment 1 can be used for the conductive film 301. As for the transparent conductive film 302, the material used for forming the transparent conductive film 141 that is formed on the surface of the source/drain wiring of the TFT, can be utilized. As the conductive film 301, a lamination film made of a WN film/W film is formed by sputtering, and as the transparent conductive film 302, an ITO film is formed. (See FIG. 15A)

Figure 15A:
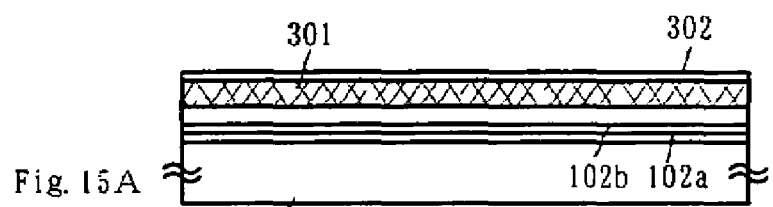
FIGS. 15A to 15F are sectional views showing a manufacturing process of a terminal portion of a connecting wiring.
Figure 15B:
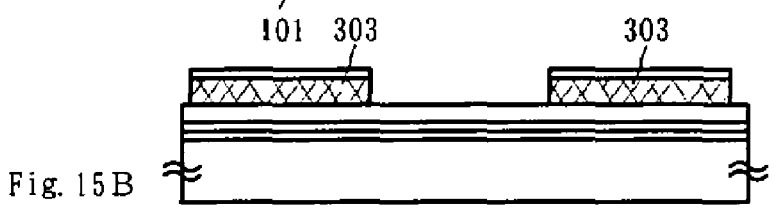
Figure 15C:
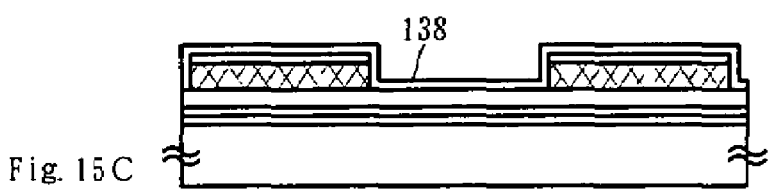
Figure 15D:
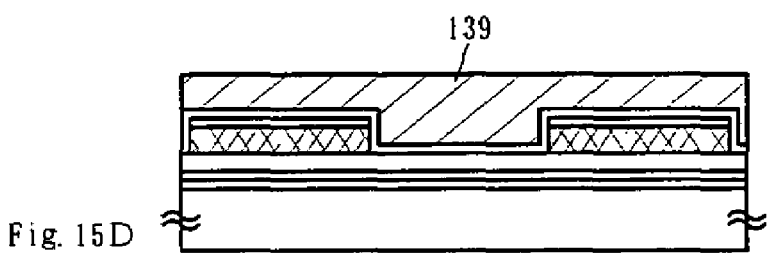
Figure 15E:
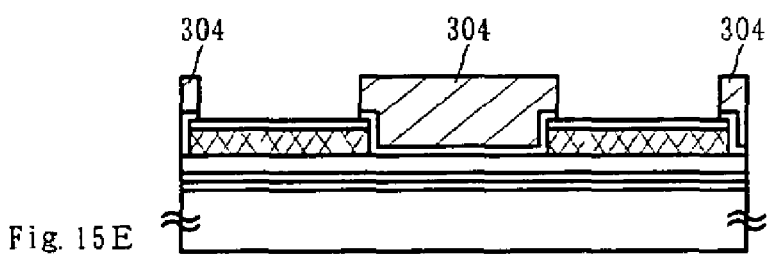
Figure 15F:
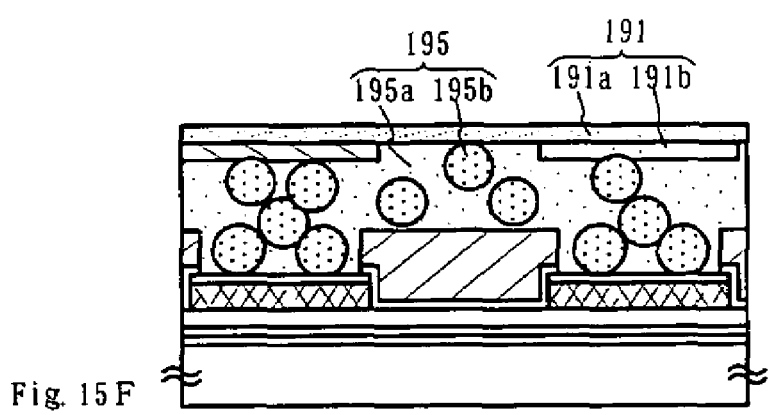

A resist mask is then formed as shown in FIG. 4A. Etching is performed on the conductive film 301 and the transparent conductive film 302, then the gate wiring of the TFT and a connecting wiring 303 as shown in FIG. 15B are formed. In the case the films are formed from a material including W as its principal constituent, it is desired that dry etching using high-density plasma be applied in order to implement a speedy and precise etching.

As one means of achieving high-density plasma, it is appropriate to employ the ICP (Inductively Coupled Plasma) etching device. In the etching method of W employing the ICP etching device two types of gas, $CF_4$ and $Cl_2$ are introduced into the reaction chamber for the etching gas, the pressure is set between 0.5 and 1.5 Pa (preferably 1 Pa), and a 200 W to 1000 W high frequency (13.56 MHz) electric power is applied to the inductively coupled portion. At this point, a 20 W high frequency electric power is applied to a stage disposed with the substrate, and by charging a negative electric potential by self-bias, a positive ion is accelerated to thereby perform anisotropic etching. By using the ICP etching device, an etching speed of between 2 and 5 nm/sec can also be attained from hard metallic films such as W. Further, in order to perform etching without leaving any residues, it is appropriate to increase the etching time about 10% to 20% to perform over-etching.

However, attention must be paid to the selective ratio of etching to a base film. For example, the selective ratio of the W film to the silicon nitride oxide film (the gate insulating film 109) is between 2.5 to 3. Due to this type of over-etching process, an exposed surface of the silicon nitride oxide film is etched between 20 and 50 nm, becoming substantially thinner.

As explained in Embodiment 1, the semiconductor film of the TFT is then doped with phosphorous and boron to thereby form a protecting insulating film 138 as shown in FIG. 5A. Then the phosphorous and boron doped into the semiconductor film is activated. (See FIG. 15C)

Thereafter, an interlayer insulating film 139 is formed as shown in FIG. 5C. The material for forming the interlayer insulating film 139 may be selected from the materials described in Embodiment 1, or the interlayer insulating film 139 may be a silicon base inorganic insulating film, or an organic resin film such as acrylic. (See FIG. 15D)

As shown in FIG. 6, a contact hole reaching the source region or the drain region, formed on an island-like semiconductor film, is formed in the protecting insulating film 138 and the interlayer insulating film 139. At the same time, in the terminal portion of the connecting wiring 303, a protecting film 304 for covering the side surface of the terminal portion is formed. (See FIG. 15e)

The rest of the processes are carried out in the same way as in Embodiment 1 to thereby complete the active matrix substrate 100. Then the active matrix substrate 100 and an opposing substrate 250 are sealed together by a sealing agent 179 with a liquid crystal substance 260 enclosed therein. The connecting wiring 303 and the FPC 191 are electrically connected by the anisotropic conductive film 195. (See FIG. 15F)

In Embodiment 2, because the side surface of the conductive film 301 of the connecting wiring 303 is covered with the protecting film 304, the conductive film 301 becomes a structure surrounded by the protecting film 304, the gate insulating film 109, and the transparent conductive film 302, and will not be exposed to air.

Embodiment 3

Embodiment 3 is a modified example of Embodiment 1 in which the sectional shape of a gate wiring is formed to be a taper shape. Further, it is also an example of forming the connecting wiring in the same manufacturing process of the gate wiring. The manufacturing process of an active matrix substrate of Embodiment 3 will be explained with references to FIGS. 17A to 19C. In this Embodiment, a method of simultaneously manufacturing a pixel TFT and a storage capacitor of a pixel portion, and a TFT of a driver circuit provided in the periphery of the pixel portion will be described in detail in accordance with the process. FIGS. 21A to 21F are diagrams showing a manufacturing method of the connecting wiring.

In FIG. 17A, a base film 602 formed from an insulating film made of a silicon oxide film, a silicon nitride film, or a silicon nitride oxide film, is formed on the surface of a glass substrate 601. In this Embodiment, the silicon nitride oxide film formed from $SiH_4$, $NH_3$, and $N_2O$ at a thickness of between 10 and 200 nm, and a hydrogenated silicon nitride oxide film 602 formed from $SiH_4$ and $N_2O$ at a thickness of between 50 and 200 nm (preferably between 100 and 150 nm) on the surface of the silicon nitride oxide film, are formed in lamination by plasma CVD.

An amorphous silicon film is next formed at a thickness of 55 nm by plasma CVD, and similar to Embodiment 1, is crystallized to thereby form a crystalline silicon film. Using a photomask PM11, a resist pattern is formed on the crystalline silicon film by a photolithography technique. A crystalline semiconductor film is divided into island shapes by dry etching to form island-like semiconductor films 604 to 608. A gaseous mixture of $CF_4$ and $O_2$ is used in the dry etching of the crystalline silicon film. Then a gate insulating film 609 is formed from the silicon nitride oxide film at a film thickness of 120 nm by plasma CVD.

Subsequently, in order to form the gate wiring on the gate insulating film 609, a heat-resistant conductive film is formed from a lamination film of metallic films 611 and 612 and a transparent conductive film 613. The metallic film 611 is formed of a WN film, the metallic film 612 is formed of a W film, and the transparent conductive film 613 is formed of an indium oxide zinc oxide alloy ($In_2O_3$—ZnO). (See FIGS. 17A and 21A)

Utilizing a second photo mask RM12, resist masks RM21 to RM27 are formed by using a photolithography technique. The transparent conductive film 613 is etched to form gate wirings 618 to 622 and a storage capacitor 623, and uppermost layers 618a to 623a and 683a of a connecting wiring 683. (See FIGS. 17B and 21B)

Figure 18A:
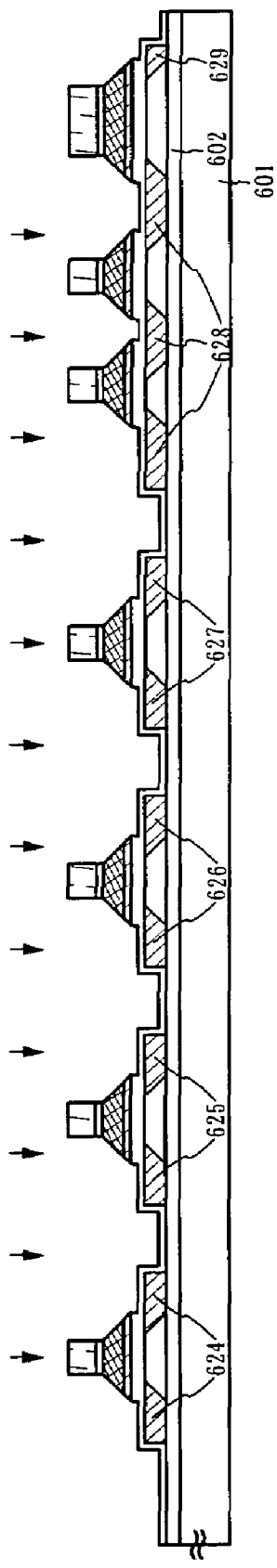
FIGS. 18A to 18C are sectional views showing a manufacturing process of an active matrix substrate.
Figure 18B:
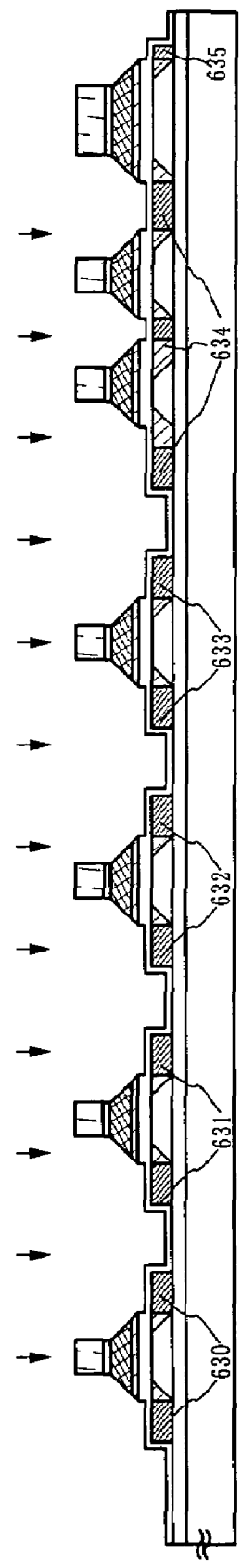
Figure 18C:
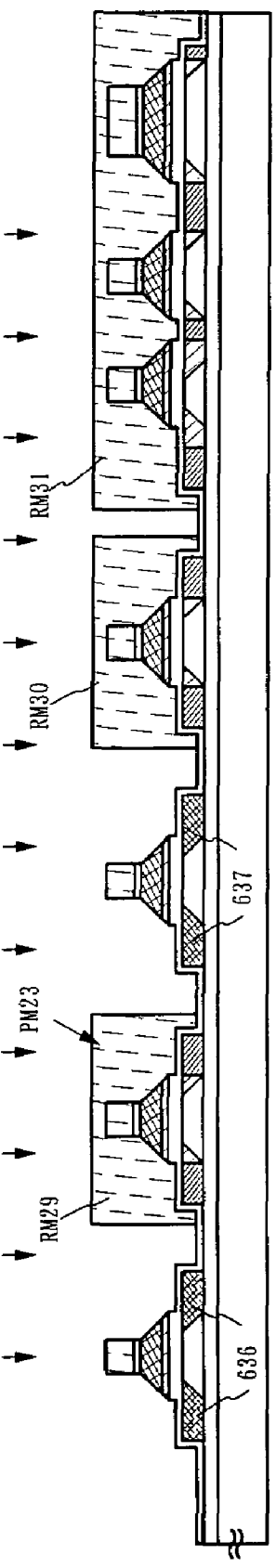
Figure 20:
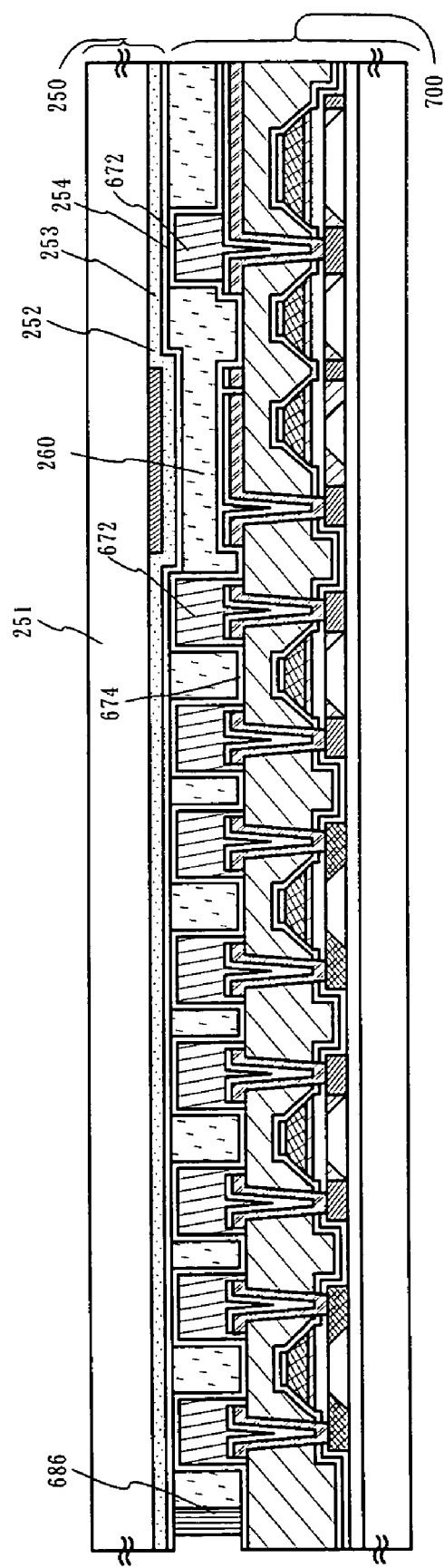
FIG. 20 is a diagram showing a sectional view of a liquid crystal panel.
Figure 21:
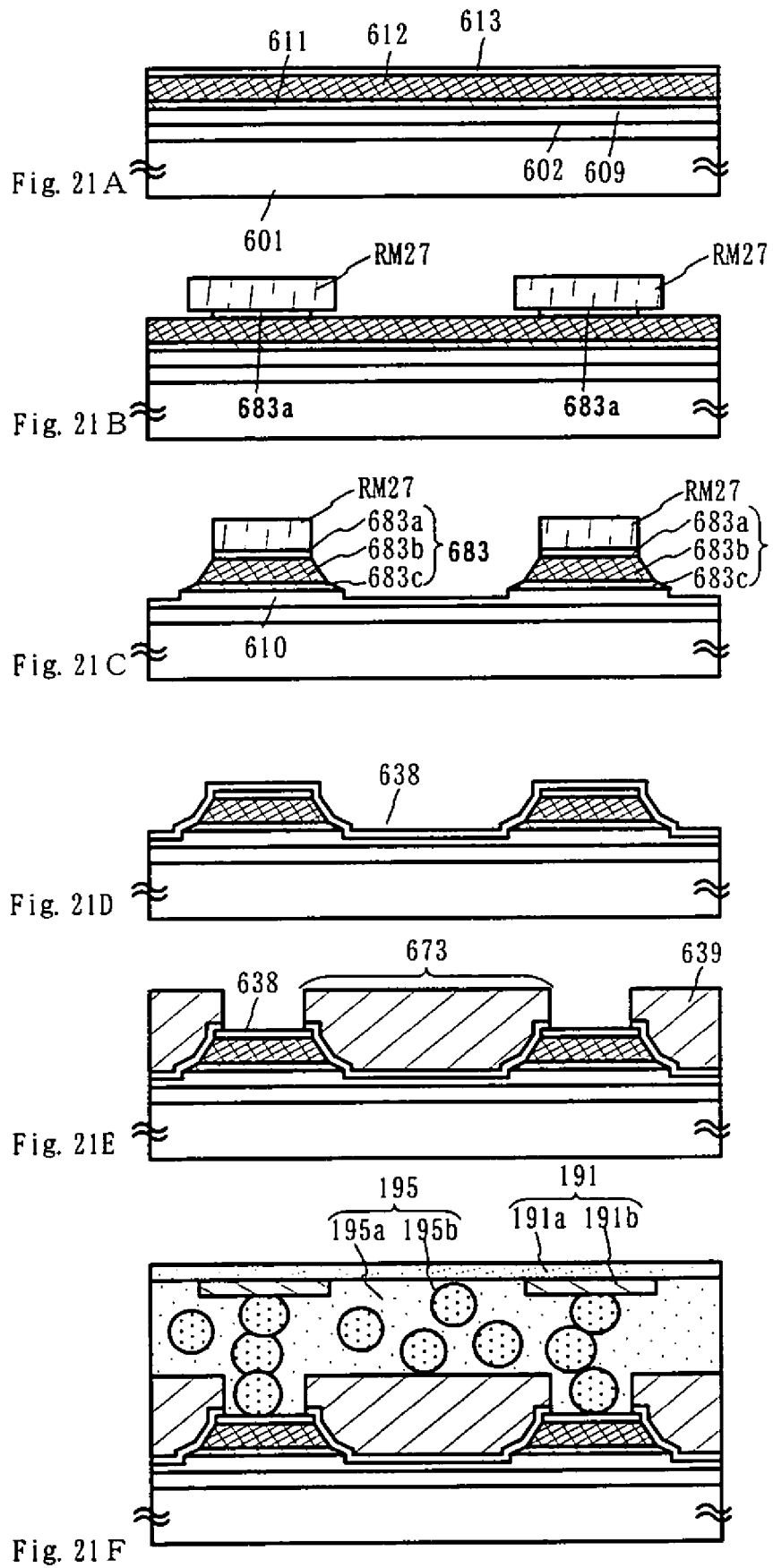
FIGS. 21A to 21F are sectional views showing a manufacturing process of a terminal portion of a connecting wiring.

As shown in FIGS. 18B and 21B, a side surface of the uppermost layers 618a to 623a and 683a, formed of the transparent conductive film, is etched further back than the resist masks RM21 to RM27. Next, the metallic films 611 and 613 are etched together to thereby complete the gate wirings 618 to 622 having taper shaped sectional surfaces, the capacitor wiring 623, and the connecting wiring 683. (See FIGS. 17C and 21C)

The wirings 618 to 623 and 683 become a laminated structure consisting of the uppermost layers 618a to 623a and 683a formed of the transparent conductive film 613, layers 618b to 623b and 683b formed of the metallic film 612, and layers 618c to 623c and 683c formed of the metallic film 611.

At this point, etching is performed such that a taper portion is formed at least in the edge portion of the gate wirings 618 to 622. This etching process is carried out with the ICP etching device. Etching is performed under the following conditions: a gaseous mixture of $CF_4$ and $Cl_2$ is used as the etching gas with the quantity of flow set to 30 SCCM, respectively; discharge power is set to 3.2 W/cm$^2$ (13.56 MHZ); bias power is set to 244 mW/cm$^2$ (13.56 MHZ); and pressure is set to 1.0 Pa. Due to such etching conditions, in the edge portion of the gate wirings 618 to 622, a taper portion with a gradual increase in thickness from the edge portion inward, is formed with an angle of between 25° and 35°, preferably 30°. The angle of the taper portion will greatly influence on a concentration incline of a low-concentration n-type impurity region, which afterwards will form an LDD region. Note that an angle $\theta 1$ of the taper portion is expressed by $Tan(\theta 1)=HG/WG$ using the length (WG) and the thickness (HG) of the taper portion.

In addition, in order to perform etching without leaving any residue, over-etching is performed approximately between 10% and 20% to the thickness of the insulating film 609. However, it is necessary to pay attention to the selective ratio of etching to a base film at this point. For example, as shown in table 1, the selective ratio of the W film to the silicon nitride oxide film (the gate insulating film 609) is between 2 and 4 (typically 3). Due to this type of over-etching treatment, an exposed surface of the silicon nitride oxide film is etched between 20 and 50 nm, becoming substantially thinner to thereby form a new shape gate insulating film 610.

The process of doping an impurity element that imparts n-type (n⁻ dope process) is performed with the purpose of forming an LDD region of an n-channel TFT of the driver circuit and the pixel TFT. Resist masks 112 to 117 used for the formation of the gate electrode are kept intact, and using the gate wirings 618 to 622 having the taper portion in the edge portion as masks, phosphorous as the impurity element that imparts n-type is doped by ion doping in a self-aligning manner (FIG. 18A)

Here in this process, in order to dope the impurity element that imparts n-type so that it passes through the taper portion of the wirings 618 to 623 and [through] the gate insulating film 610 reaching the semiconductor film positioned underneath, the acceleration voltage is set high, between 80 and 160 keV, and the dose quantity is set low, between $1\times10^{13}$ and $5\times10^{14}$ atoms/cm$^3$ for the purpose of forming an LDD region. The concentration of the impurity element to be doped into the semiconductor film is doped in the concentration range of between $1\times10^{16}$ and $1\times10^{19}$ atoms/cm$^3$. Low-concentration n-type impurity regions 624 to 629 are thus formed in the island-like semiconductor film as shown in FIG. 18A.

In this process, in the low-concentration n-type impurity regions 624 to 628, at least the concentration inclination of phosphorous that is included in the portions that are overlaped with the gate wirings 618 to 622 reflects the change in film thickness of the taper portion of the gate wiring 618 to 622. In other words, in the region overlapping the gate wiring, low-concentration n-type impurity regions 624 to 628 gradually becomes higher towards the side surface of the gate wiring. This is because of the concentration change of phosphorous that has reached the semiconductor film due to the difference in the film thickness of the taper portion. Note that FIG. 18A is a diagram showing a perspective view of the low-concentration n-type impurity regions 624 to 628. However, this diagram is not exactly a view showing the regions doped with phosphorous, but rather a view showing the above change in concentration of phosphorous occurring in accordance with the shape of the taper portion of the gate wirings 618 to 622.

The formation of high-concentration n-type impurity regions for functioning as a source region or a drain region in the n channel TFT are performed next (n$^+$ dope process). Leaving the resist masks RM21 to RM26 intact, phosphorous is doped by the ion doping method under the condition of a low acceleration voltage of between 10 and 30 keV so that this time the gate wiring 618 to 622 functions as masks to shield phosphorous. The high-concentration n-type impurity regions 630 to 635 are thus formed. Since the gate insulating film 610 for covering these regions 630 to 635 has been treated with over-etching in the process forming the gate wiring, the film thickness of the gate insulating film has become thinner to between 70 and 100 nm compared with the initial thickness of 120 nm. Accordingly, phosphorous can be doped appropriately even under such a condition as low acceleration voltage. The concentration of phosphorous of these regions 630 to 635 is set to be in the concentration range of between $1\times10^{20}$ and $1\times10^{21}$ atoms/cm$^3$. (See FIG. 18B)

High-concentration p-type impurity regions 636 and 637 as the source region and the drain region are formed in the island-like semiconductor films, 604 and 606 for forming the p channel TFT. Using the gate wirings 618 and 120 as masks here, an impurity element that imparts p-type is doped to thereby form the high-concentration p-type impurity regions 636 and 637 in a self-aligning manner. At this point, the island-like semiconductor films 605, 107, and 108 for forming the n-channel TFT are covered entirely with resist masks RM29 through RM31 formed by using the third photo mask PM23. (See FIG. 18C)

The impurity regions 636 and 637 to be formed here are formed by means of ion doping using diborane ($B_2H_6$). The boron (B) concentration in the high-concentration p-type impurity regions that are not overlaped with the gate wiring is set to be between $3\times10^{20}$ and $3\times10^{21}$ atoms/cm$^3$. In addition, because an impurity element is also doped into the impurity region that are overlaped with the gate wiring via the gate insulating film and the taper portion of the gate electrode, the region is formed as a substantially low-concentration p-type impurity region with the concentration set to at least $1.5\times10^{19}$ atoms/cm$^3$ or more. The concentration of boron (B) is set to be 1.5 to 3 times that of phosphorous doped in the process of FIG. 18A. Accordingly, no problem of any kind will occur for the p-type impurity regions to function as the source region and the drain region of the p-channel TFT.

Thereafter, a protecting insulating film 638 made of oxidized silicon nitride is formed as shown in FIGS. 19A and 21D. The silicon nitride oxide film is formed from $SiH_4$, $N_2O$, and $NH_3$ by plasma CVD. The process of activating the impurity elements imparting the n-type or p-type that has been doped at respective concentrations is performed by means of thermal annealing using the annealing furnace.

Following the activation process, heat treatment is performed at between 300 and 450° C. for 1 to 12 hours in an atmosphere in which the atmosphere gas has been changed to contain 3% to 100% of hydrogen, and then the hydrogenation process for the island-like semiconductor film is carried out. This process is to terminate the $10^{16}$ to $10^{18}$/cm$^3$ of dangling bonds in the island-like semiconductor film by the thermally excited hydrogen.

After the completion of the activation and the hydrogenation processes, an interlayer insulating film 639 is formed so that an average film thickness thereof falls between 1.0 and 2.0 mm. (See FIGS. 19B and 21E)

Thereafter, a resist mask of a predetermined pattern is formed using a fourth photomask PM24, and a contact hole that reaches the source region or the drain region formed in the respective island-like semiconductor films, and a protecting film 673 for covering the side surface of connecting wiring 683 is formed as shown in FIG. 21E.

This process is performed by means of dry etching. In this case, first the interlayer insulating film 639 made from an organic resin material is etched using a gaseous mixture of $CF_4$, $O_2$, and He as etching gas, and then the protecting insulating film 638 is etched with $CF_4$ and $O_2$ as etching gas. Furthermore, in order to raise the selective ratio to the island-like semiconductor film, the etching gas is changed to $CHF_3$ to etch the gate insulating film 610 whereby a contact hole can be nicely formed.

As shown in FIG. 21E, because the side surface of the connecting wiring 683 is covered with the protecting film 673, the surface of the layers 683b and 683c, formed from the metallic film of the connecting wiring 683, is in a state surrounded by and in contact with the layer 683a formed from the transparent conductive film, the gate insulating film 610, and the protecting film 673. Therefore, the surface of the layers 683a and 683b will not be exposed to air.

Then the metallic film formed of a lamination film of the Ti film (between 50 and 150 nm)/the Al film (between 300 and 400 nm) and the transparent conductive film are formed, with the transparent conductive film formed on the surface of the metallic film at a thickness of between 80 and 120 nm. As shown in FIG. 19C, the metallic film is formed by sputtering or vacuum evaporation, a resist mask pattern is formed by using a fifth photomask PM25, and the metallic film and the transparent conductive film are etched to thereby form source wirings 648 to 652 and drain wirings 653 to 657. The drain wiring 657 here is for functioning as the pixel electrode. The drain wiring 658 indicates the pixel electrode of a neighboring pixel.

In a first p-channel TFT 700 of the driver circuit, a channel forming region 706, a source region 707 and a drain region 708 formed from the high-concentration p-type impurity region are formed in the island-like semiconductor film 604. In the regions 707 and 708, the region that are overlaped with the gate electrode has become an LDD region with a low concentration of boron.

In a first n-channel TFT 701, the island-like semiconductor film 605 is composed of a channel forming region 709, LDD regions 710 and 711 formed from the low-concentration n-type impurity region and overlaped with the gate wiring, and a source region 713 and a drain region 712 formed from the high-concentration n-type impurity region.

The concentration distribution of phosphorous in this LDD region increases as it becomes far from the channel forming region 709. The proportion of increase differs depending on conditions such as the acceleration voltage and the dose quantity of ion doping, the taper angle θ and the thickness of the gate wiring 619. With the edge portion of the gate electrode formed into a taper shape, the impurity element can be doped through the taper portion. Accordingly, an impurity region in which the concentration of the impurity element gradually changes can be formed in the semiconductor film existing underneath the taper portion. The present invention actively utilizes the impurity region described above. By forming this type of LDD region in the n-channel TFT, the high electric field that generates in the vicinity of the drain region can be relaxed to thereby prevent the generation of a hot carrier, and prevention of the TFT from deteriorating can be realized.

Similar to the TFT 700, a second p-channel TFT 702 of the driver circuit has a channel forming region 714, and a source region 715 and a drain region 716 formed from the high-concentration p-type impurity region in the island-like semiconductor film 606. In the regions 715 and 716, the region that are overlaped with the gate wiring has become a p-type LDD with region h a low concentration of boron.

In a second n-channel TFT 703, the island-like semiconductor film 607 has a channel forming regions 717, LDD regions 718 and 719 are overlaped with a gate electrode 621, and a source region 720 and a drain region 721 formed from the high-concentration n-type impurity region. The LDD regions 718 and 719 are structured similarly to the LDD regions 711 and 712.

In the pixel TFT 704, the island-like semiconductor film 608 has a channel forming regions 723 and 724, LDD regions 725 to 728 formed from the low-concentration n-type impurity region, and source or drain regions 729 to 731 formed from the high-concentration n-type impurity region. The LDD regions 725 to 728 are structured similarly to the LDD regions 711 and In addition, in the storage capacitor 705, a channel forming region 732, LDD regions 733 and 734, and a high-concentration n-type impurity region 735 in the semiconductor film 608 are revised so that the gate insulating film 610 becomes a dielectric, and the storage capacitor 623 and the semiconductor film 608 become electrodes.

Subsequently, similar to Embodiment 1, a column-shape spacer 672 for maintaining the space between substrates is formed using a sixth photomask, and an opposing film 674 is formed to thereby perform rubbing. Similarly to Embodiment 1, the opposing substrate 250 and the active matrix substrate 700 are stuck together by a sealing agent 686 with a liquid crystal material 260 enclosed in the gap between the substrate. The structure of the opposing substrate 250 is the same as that of FIG. 8.

In addition, in the terminal portion of the connecting wiring 683, the FPC 191 is electrically connected thereto by the anisotropic conductive film 195 in which conductive grains 195b are dispersed to an adhesive 195a as shown in FIG. 21F. In the FPC 191, reference numeral 191a denotes a substrate made of a material such as polyimide and reference numeral 191b denotes a wiring made of copper etc.

Though a top gate TFT has been shown in Embodiments 1 through 3, a person skilled in the art can readily replace this with a bottom gate TFT. Further, the active matrix substrate has been described in these embodiments, and needless to say, the structure of the connecting wiring of these embodiments is applicable to other semiconductor devices. For the case of forming the protecting film of the connecting wiring from the interlayer insulating film of the TFT as in Embodiments 2 and 3, it is applicable to a semiconductor device having a circuit formed of the TFT such as an active matrix type EL device.

Embodiment 4

The active matrix substrate, the liquid crystal display device and the EL display device fabricated in accordance with the present invention can be used for various electro-optical devices. The present invention can be applied to all those electronic appliances that include such an electro-optical device as the display medium. Examples of the electronic appliances include a personal computer, a digital camera, a video camera, a portable information terminal (a mobile computer, a cellular telephone, an electronic book or the like), and a navigation system. FIGS. 23A to 23F show examples of these.

Figure 23A:
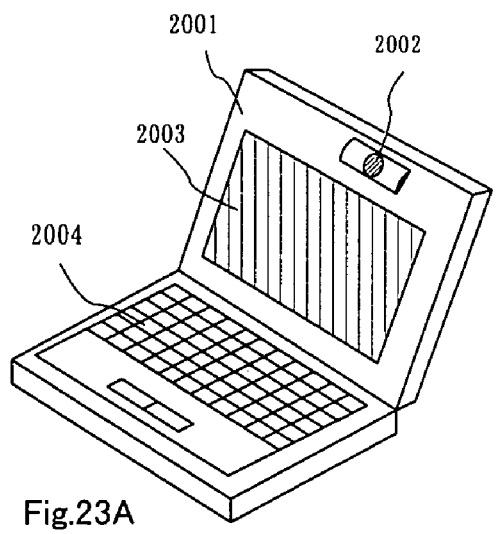
FIGS. 23A to 23F are diagrams showing examples of semiconductor devices.

FIG. 23A shows a personal computer, which comprises: a main body 2001 incorporating a microprocessor and a memory, etc.; an image input section 2002; a display device 2003; and a keyboard 2004. The present invention can form the display device 2003 or other signal processing circuits.

Figure 23B:
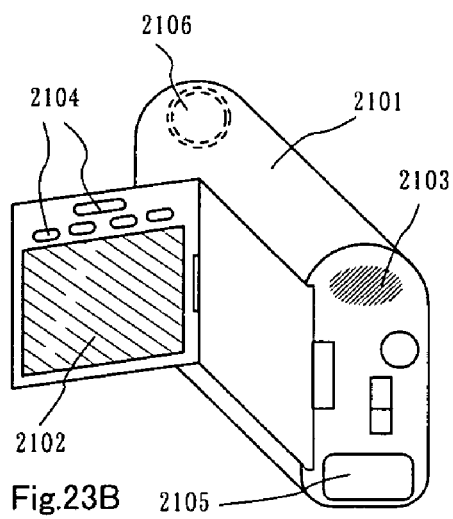

FIG. 23B shows a video camera, which comprises: a main body 2101; a display device 2102; a sound input section 2103; an operation switch 2104; a battery 2105; and an image receiving section 2106. The present invention can be applied to the display device 2102 or other signal control circuits.

Figure 23C:
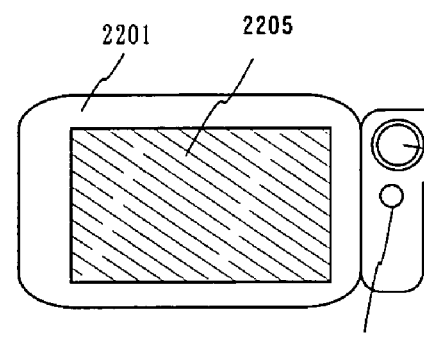

FIG. 23C shows the portable information terminal, that comprises: a main body 2201; an image input section 2202; an image receiving section 2203; an operation switch 2204; and a display device 2205. The present invention can be applied to the display device 2205 or other signal controlling circuits.

Such a portable information terminal is often used outdoors as well as indoors. To operate the terminal for a long time, a reflection type liquid crystal display device utilizing external light is more suitable for the low power consumption type than the type using back-light. However, when the environment is dark, a transmission type liquid crystal display device equipped with back-light is more suitable. Under such circumstances, a hybrid type liquid crystal display device having the features of both reflection type and transmission type has been developed. The present invention can be also applied to such a hybrid type liquid crystal display device.

Figure 22:
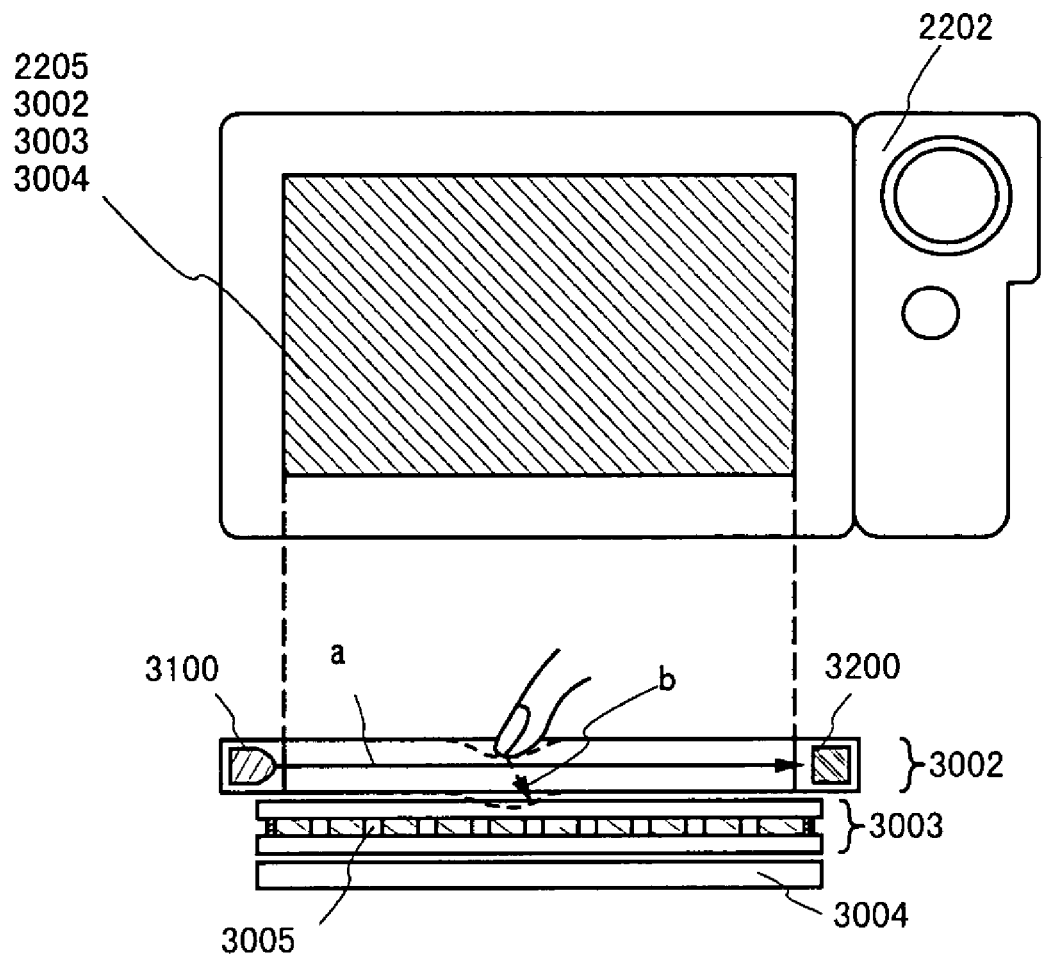
FIG. 22 is a diagram showing an example of a semiconductor device.

FIG. 22 shows an example of applying a liquid crystal panel of Embodiment 1 to a portable information terminal. The display device 2205 comprises a touch panel 3002, a liquid crystal display device 3003 and LED back-light 3004. The touch panel 3002 is provided so as to easily operate the portable information terminal. A light emitting element 3100 such as LED is disposed at one of the ends of the touch panel 3002 and a light receiving device 3200 such as a photo-diode is disposed at the other end. An optical path is defined between them. When the touch panel 3002 is pushed and the optical path is cut off, the output of the light receiving element 3200 changes. When these light emitting elements and light receiving elements are disposed in matrix on the liquid crystal display device by utilizing this principle, the touch panel can be allowed to function as the input medium.

Figure 23D:

FIG. 23D shows an electronic game machine such as a television game or a video game. It comprises a main body 2301 having mounted thereto an electronic circuit 2308 such as a CPU, a recording medium 2304, etc.; a controller 2305; a display device 2303; and a display device 2302 that is assembled in the main body 2301. The display device 2303 and the display device 2302 assembled in the main body 2301 may display the same information. Alternatively, the former may be used mainly as a main display device and the latter, as a sub-display device to display the information of the recording medium 2304, the operation condition of the apparatus or as an operation board by adding the function of a touch sensor. The main body 2301, the controller 2305 and the display device 2303 may have wire communication functions to transmit signals between them, or may be equipped with sensor units 2306 and 2307 for achieving wireless communication or optical communication function. The present invention can be applied to the display devices 2302 and 2303. A conventional CRT may be used for the display device 2303.

Figure 23E:
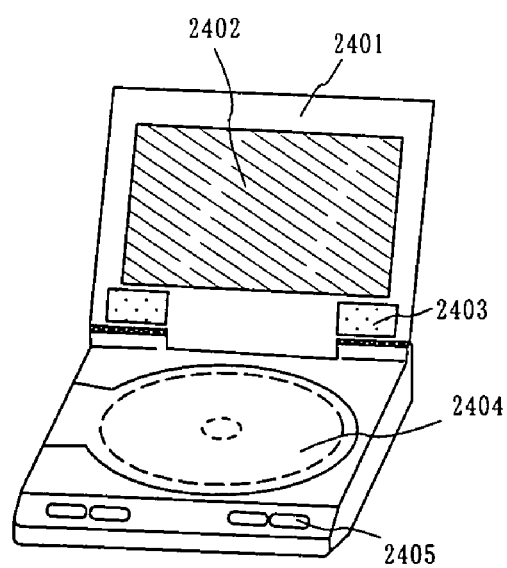

FIG. 23E shows a player that uses a recording medium storing a program (hereinafter called the "recording medium"). It comprises a main body 2401, a display device 2402, a speaker unit 2403, a recording medium 2404 and an operation switch 2405. Incidentally, a DVD (Digital Versatile Disc) or a compact disk (CD) can be used for the recording medium to reproduce a music program or to display images or information display such as a video game (or a television game) and information display through the Internet. The present invention can be utilized suitably for the display device 2402 and other signal control circuits.

Figure 23F:
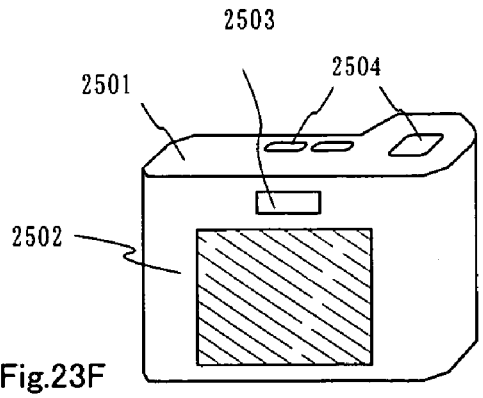

FIG. 23F shows a digital camera, which comprises: a main body 2501; a display device 2502; a view finder section 2503; an operation switch 2504; and an image reception unit (not shown). The present invention can be applied to the display unit 2502 or other signal control circuits.

Figure 24A:
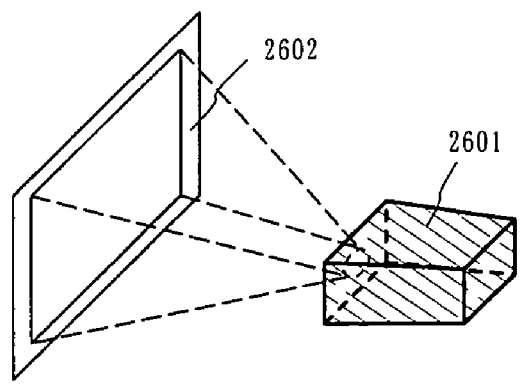
FIGS. 24A to 24D are diagrams showing a structure of a projector type liquid crystal display device.
Figure 24B:
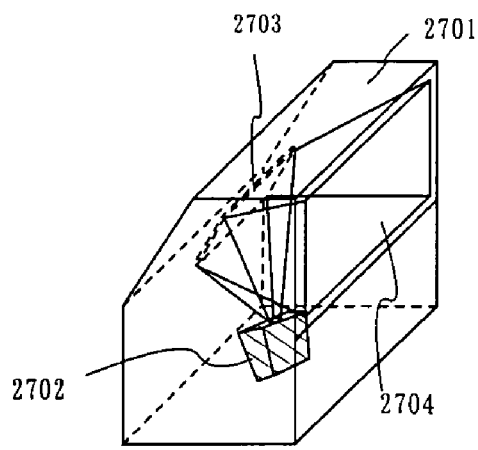

FIG. 24A shows a front type projector, which comprises: a light source optical system and a display device 2601; and a screen 2602. The present invention can be applied to the display device and other signal control circuits. FIG. 24B shows a rear type projector, which comprises: a main body 2701; a light source optical system and a display device 2702; a mirror 2703; and a screen 2704. The present invention can be applied to the display device or other signal control circuit.

Figure 24C:
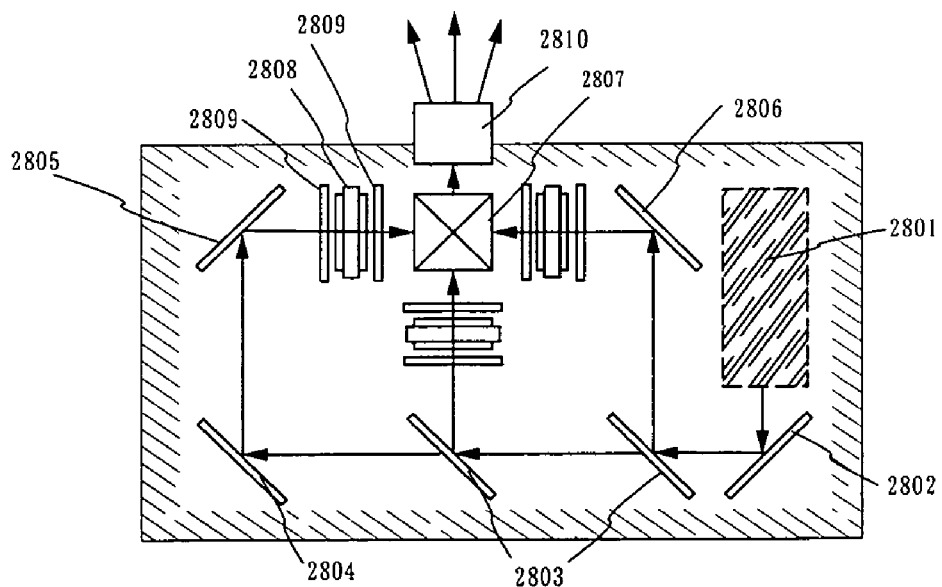

Incidentally, FIG. 24C shows an example of the construction of the light source optical system and the display devices 2601 and 2702 in FIGS. 24A and 24B. The light source optical system and the display device 2601 and 2702 comprise a light source optical system 2801, mirrors 2802, 2804 to 2806, a dichroic mirror 2803, a beam splitter 2807, a liquid crystal display device 2808, a phase difference plate 2809 and a projection optical system 2810. The projection optical system 2810 comprises a plurality of optical lenses.

Figure 24D:
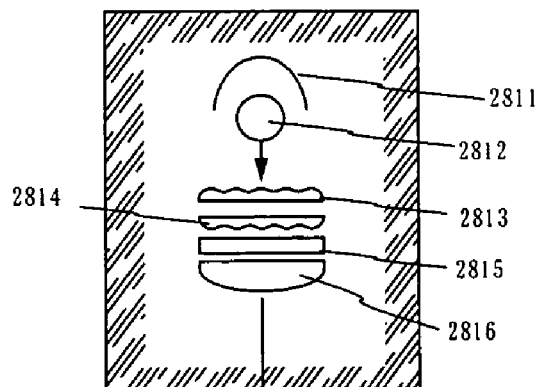

FIG. 24C shows an example of the three-plate system that uses three liquid crystal display devices 2808. However, the present invention is not limited to such a system, but may be applied to a single-plate optical system. Optical lenses, a film having a polarization function, a film for adjusting the phase, an IR film, etc, may be inserted appropriately in the optical path indicated by an arrow in FIG. 24C. FIG. 24D shows a structural example of the light source optical system 2801 in FIG. 24C. In this embodiment, the light source optical system 2801 comprises: a reflector 2811; a light source 2812; lens arrays 2813 and 2814; a polarization conversion element 2815; and a convergent lens 2816. Incidentally, the light source optical system shown in FIG. 24D is an example but is in no way restrictive.

The present invention can be further applied to a read circuit of a navigation system or an image sensor, though they are not shown in the drawings. The application range of the present invention is thus extremely broad, and the present invention can be applied to electronic appliances of all fields.

By implementing the present invention, in the connecting wiring connected to another circuit by means of the anisotropic conductive film, the connecting wiring becomes a structure in which the metallic film is covered with the protecting film and the transparent conductive film. Accordingly, corrosion and change in quality of the metallic film caused by manufacturing processes and contact with the adhesives of the anisotropic conductive film can be prevented to thereby form a contact structure high in reliability.

What is claimed is:

1. A semiconductor device comprising:
a first substrate;
a thin film transistor over said first substrate;
a second substrate opposing to said first substrate;
a wiring provided with said second substrate;
a connecting wiring for electrically connecting said wiring of the second substrate to said thin film transistor over said first substrate, wherein said connecting wiring comprises a metallic film over said first substrate and a transparent conductive film over said metallic film;
an insulating film over said first substrate; and
an anisotropic conductive film over said insulating film and said connecting wiring,
wherein said metallic film has a taper shape,
wherein the wiring of the second substrate is connected to a portion of the connecting wiring, and
wherein a side surface of the metallic film and a side surface of the transparent conductive film are in contact with the insulating film.

2. A semiconductor device according to claim 1 wherein the insulating film comprises a same material as that contained in an insulating film between a gate wiring and a source wiring of the thin film transistor.

3. A semiconductor device according to claim 1 wherein a thickness of the metallic film is between 100 nm and 1 μm.

4. A semiconductor device according to claim 1 wherein the metallic film comprises Al.

5. A semiconductor device according to claim 1 wherein the metallic film comprises W.

6. A semiconductor device according to claim 1 wherein the metallic film is a lamination film comprising a W layer and a layer comprising W and N.

7. A semiconductor device according to claim 1 wherein a thickness of the transparent conductive film is between 50 nm and 0.5 μm.

8. A semiconductor device according to claim 1 wherein the transparent conductive film comprises zinc oxide.

9. A semiconductor device according to claim 1 wherein the transparent conductive film comprises zinc oxide and indium oxide.

10. The semiconductor device according to claim 1 wherein said semiconductor device is one of a liquid crystal display device and EL display device.

11. A semiconductor device according to claim 1 wherein the connecting wiring is formed of the same materials as those of a source wiring and a drain wiring of the thin film transistor.

12. The semiconductor device according to claim 1, wherein the anisotropic conductive film covers the portion of the connecting wiring.

13. The semiconductor device according to claim 1, wherein the thin film transistor is selected from the group consisting of a top gate thin film transistor and a bottom gate thin film transistor.

14. The semiconductor device according to claim 1, wherein the anisotropic conductive film comprises a conductive grain dispersed to an adhesive.

15. The semiconductor device according to claim 1, wherein the anisotropic conductive film is not in contact with the both side surfaces of the portion of the connecting wiring.

16. The semiconductor device according to claim 1, wherein the thin film transistor is formed in a driver circuit.

17. A semiconductor device comprising:
a first substrate;
a thin film transistor over said first substrate;
a second substrate opposing to said first substrate;
a wiring provided with said second substrate;
a connecting wiring for electrically connecting said wiring of the second substrate to said thin film transistor over said first substrate, wherein said connecting wiring comprises a metallic film over said first substrate and a transparent conductive film over said metallic film;
a column-shape spacer formed over said thin film transistor for maintaining a space between said first substrate and said second substrate;
an insulating film over said first substrate; and
an anisotropic conductive film over said insulating film and said connecting wiring,
wherein said metallic film has a taper shape,
wherein the wiring of the second substrate is connected to a portion of the connecting wiring, and
wherein a side surface of the metallic film and a side surface of the transparent conductive film are in contact with the insulating film.

18. A semiconductor device according to claim 17 wherein a thickness of the metallic film is between 100 nm and 1 μm.

19. A semiconductor device according to claim 17 wherein the metallic film comprises Al.

20. A semiconductor device according to claim 17 wherein the metallic film comprises W.

21. A semiconductor device according to claim 17 wherein the metallic film is a lamination film comprising a W layer and a layer comprising W and N.

22. A semiconductor device according to claim 17 wherein a thickness of the transparent conductive film is between 50 nm and 0.5 μm.

23. A semiconductor device according to claim 17 wherein the transparent conductive film comprises zinc oxide.

24. A semiconductor device according to claim 17 wherein the transparent conductive film comprises zinc oxide and indium oxide.

25. The semiconductor device according to claim 17 wherein said semiconductor device is one of a liquid crystal display device and EL display device.

26. A semiconductor device according to claim 17 wherein the connecting wiring is formed of the same materials as those of a source wiring and a drain wiring of the thin film transistor.

27. The semiconductor device according to claim 17, wherein the anisotropic conductive film covers the portion of the connecting wiring.

28. The semiconductor device according to claim 17, wherein the thin film transistor is selected from the group consisting of a top gate thin film transistor and a bottom gate thin film transistor.

29. The semiconductor device according to claim 17, wherein the anisotropic conductive film comprises a conductive grain dispersed to an adhesive.

30. The semiconductor device according to claim 17, wherein the anisotropic conductive film is not in contact with the both side surfaces of the portion of the connecting wiring.

31. The semiconductor device according to claim 17, wherein the thin film transistor is formed in a driver circuit.

* * * * *